US012566511B2

(12) United States Patent
Baek et al.

(10) Patent No.: US 12,566,511 B2
(45) **Date of Patent: \*Mar. 3, 2026**

(54) FORCE SENSOR AND DISPLAY DEVICE INCLUDING THE SAME

(71) Applicant: SAMSUNG DISPLAY CO., LTD., Yongin-si (KR)

(72) Inventors: Kwang Hyun Baek, Asan-si (KR); Ji Hun Ryu, Hwaseong-si (KR); Chang Min Park, Gwangmyeong-si (KR); Jeong An Hong, Yongin-si (KR)

(73) Assignee: SAMSUNG DISPLAY CO., LTD., Yongin-si (KR)

( \* ) Notice: Subject to any disclaimer, the term of this patent is extended or adjusted under 35 U.S.C. 154(b) by 0 days.

This patent is subject to a terminal disclaimer.

(21) Appl. No.: 18/417,566

(22) Filed: Jan. 19, 2024

(65) Prior Publication Data

US 2024/0153302 A1 May 9, 2024

Related U.S. Application Data

(63) Continuation of application No. 17/362,928, filed on Jun. 29, 2021, now Pat. No. 11,908,223.

(30) Foreign Application Priority Data

Sep. 17, 2020 (KR) ........................ 10-2020-0119556

(51) Int. Cl.
*G06F 3/041* (2006.01)
*G06V 40/12* (2022.01)
(Continued)

(52) U.S. Cl.
CPC ........ *G06F 3/0412* (2013.01); *G06V 40/1306* (2022.01); *G06V 40/1318* (2022.01);
(Continued)

(58) Field of Classification Search
CPC ........... G06V 40/1306; G06V 40/1318; G06V 40/1365; H10K 59/12; H10K 59/65; H10K 59/8731; G06F 3/0412; G06F 3/04164
See application file for complete search history.

(56) References Cited

U.S. PATENT DOCUMENTS

2018/0235088 A1 8/2018 Zhang
2019/0212600 A1\* 7/2019 Yueh ................... G02F 1/13452
(Continued)

FOREIGN PATENT DOCUMENTS

CN 110519432 B 4/2021
KR 10-1796660 11/2017
(Continued)

OTHER PUBLICATIONS

Thermal Expansion Coefficient: Metals, Alloys, and Common Materials, https://www.samaterials.com/thermal-expansion-coefficient-metals-alloys-and-common-materials.html.\*

*Primary Examiner* — Abhishek Sarma
(74) *Attorney, Agent, or Firm* — F. CHAU & ASSOCIATES, LLC

(57) ABSTRACT

A display device includes a display panel; a metal plate and a filling member disposed on a same layer on a bottom surface of the display panel and that include different materials; a fingerprint sensor disposed on a bottom surface of the filling member and that overlaps the filling member; and a member-sensor bonding member disposed between the fingerprint sensor and the filling member and that bonds the fingerprint sensor to the filling member. At least a part of a side surface of the filling member and a side surface of the metal plate are spaced apart from each other with an air gap therebetween.

12 Claims, 20 Drawing Sheets

(51) Int. Cl.
    *G06V 40/13*       (2022.01)
    *H10K 59/12*       (2023.01)
    *H10K 59/65*       (2023.01)
    *H10K 59/80*       (2023.01)

(52) U.S. Cl.
    CPC ......... *G06V 40/1365* (2022.01); *H10K 59/65*
        (2023.02); *H10K 59/12* (2023.02); *H10K*
               *59/8731* (2023.02)

(56)             References Cited

U.S. PATENT DOCUMENTS

| | | |
|---|---|---|
| 2020/0073447 A1 | 3/2020 | Zhang |
| 2022/0083758 A1 | 3/2022 | Baek et al. |

FOREIGN PATENT DOCUMENTS

| | | |
|---|---|---|
| KR | 10-2018-0059720 A | 6/2018 |
| KR | 10-2018-0116188 A | 10/2018 |
| KR | 2020-0021018 | 2/2020 |
| KR | 2020-0048286 | 5/2020 |
| KR | 2020-0090282 | 7/2020 |
| TW | 201830281 A | 8/2018 |

* cited by examiner

NFA1

FA

NFA2

PH

DR2

DR1

FORCE SENSOR AND DISPLAY DEVICE INCLUDING THE SAME

CROSS-REFERENCE TO RELATED APPLICATION

This non-provisional application is a continuation of U.S. patent application Ser. No. 17/362,928, filed on Jun. 29, 2021 in the U.S. Patent and Trademark Office, which claims priority under 35 U.S.C. 119 from Korean Patent Application No. 10-2020-0119556, filed on Sep. 17, 2020 in the Korean Intellectual Property Office, the contents of both of which are herein incorporated by reference in their entireties.

1. TECHNICAL FIELD

Embodiments of the present disclosure are directed to a display device and a semiconductor device.

2. DESCRIPTION OF THE RELATED ART

A display device is incorporated into various electronic devices, such as a smartphone, a tablet, a notebook computer, a monitor, or a television (TV), etc. With recent advances in mobile communication technology, the use of portable electronic devices such as smartphones, tablets, or notebook computers, has increased enormously. Privacy information is stored in the portable electronic device. Accordingly, to protect the privacy information of a portable electronic device, fingerprint authentication has been used, in which a user's fingerprint is used for authentication. To this end, a display device includes a fingerprint sensor for fingerprint authentication.

A fingerprint sensor may be implemented as an optical sensor, an ultrasonic sensor, a capacitive sensor, etc. A fingerprint sensor is typically disposed under a display panel of the display device, and several components may be disposed between the display panel and the fingerprint sensor. An incident signal transmitted from the fingerprint sensor is reflected from the user's fingerprint and received back as a reflected signal by the fingerprint sensor.

SUMMARY

Embodiments of the present disclosure provide a display device that improves structural deformation caused by thermal expansion of a filling member in a through hole of a metal plate.

According to an embodiment of the present disclosure, there is provided a display device, including: a display panel; a metal plate and a filling member disposed on a same layer on a bottom surface of the display panel, wherein a material of the metal plate differs from a material of the filling member; a fingerprint sensor disposed on a bottom surface of the filling member and that overlaps the filling member; and a bonding member disposed between the fingerprint sensor and the filling member and that bonds the fingerprint sensor to the filling member, wherein at least a part of a side surface of the filling member and a side surface of the metal plate are spaced apart from each other with an air gap therebetween.

According to another embodiment of the present disclosure, there is provided a display device, including: a display panel; a metal plate and a filling member disposed on a same layer on a bottom surface of the display panel, wherein a material of the metal plate differs from a material of the filling member; a fingerprint sensor disposed on a bottom surface of the filling member and that overlaps the filling member; and a bonding member disposed between the fingerprint sensor and the filling member and that bond the fingerprint sensor to the filling member, wherein a side surface of the filling member and a side surface of the metal plate are adjacent to each other.

According to another embodiment of the present disclosure, there is provided a display device, including: a display panel; a metal plate disposed on a bottom surface of the display panel, wherein the metal plate includes a through hole; and a filling member disposed in the through hole on a same layer as the metal plate on the bottom surface of the display panel, and that includes a different material from the metal plate, wherein at least a part of a side surface of the filling member and a side surface of the metal plate are spaced apart from each other with an air gap therebetween.

According to a display device according to embodiments that includes a fingerprint sensor, structural deformation due to thermal expansion of a filling member that fills a through hole of a metal plate is reduced.

BRIEF DESCRIPTION OF THE DRAWINGS

FIG. 1 is a perspective view of a display device according to an embodiment.

DETAILED DESCRIPTION

Figure 2:
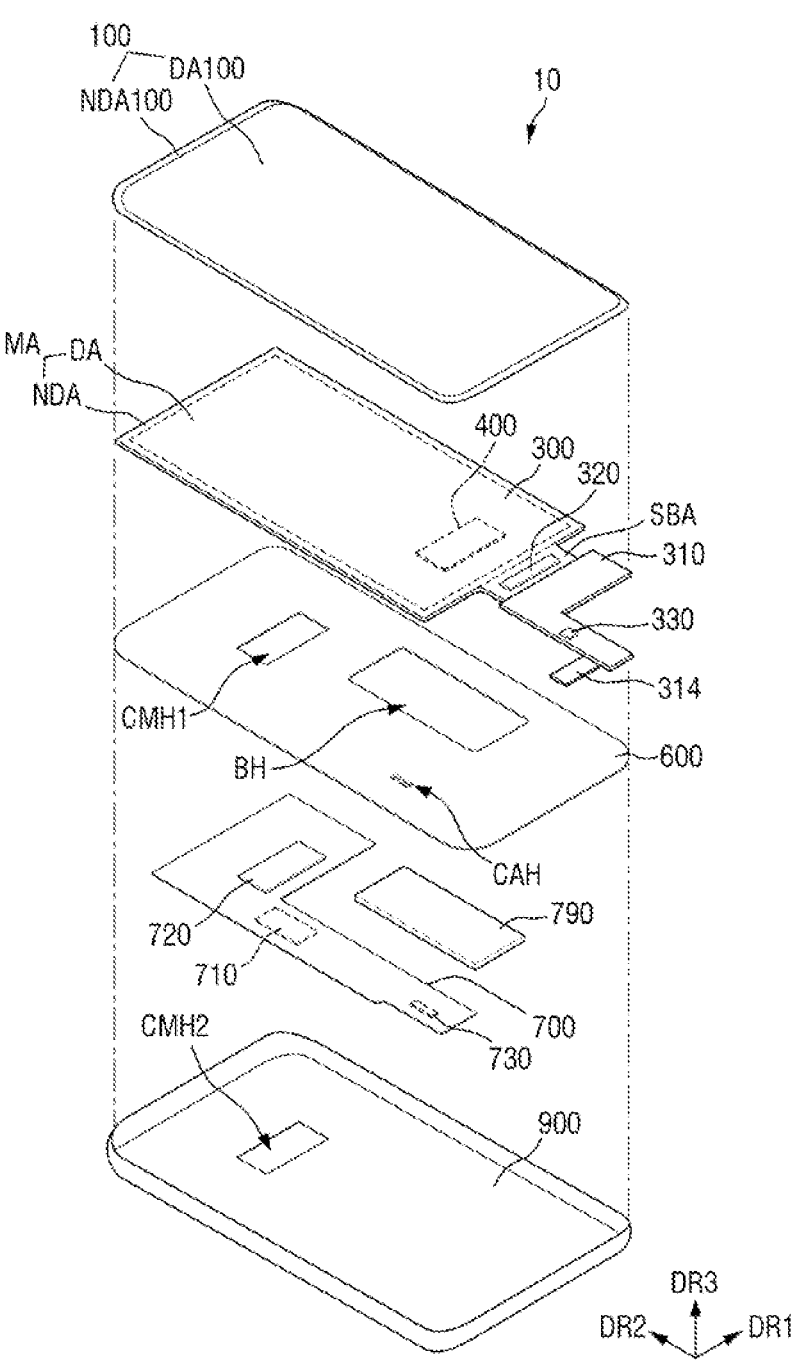
FIG. 2 is an exploded perspective view of a display device according to an embodiment.

It will be understood that when an element is referred to as being related to another element such as being "coupled" or "connected" to another element, it can be directly coupled or connected to the other element or intervening elements may be present therebetween.

Throughout the specification, the same reference numerals may refer to the same or like parts.

"About" or "approximately" as used herein is inclusive of the stated value and means within an acceptable range of deviation for the particular value as determined by one of ordinary skill in the art, considering the measurement in question and the error associated with measurement of the particular quantity, i.e., the limitations of the measurement system.

Hereinafter, embodiments of the disclosure will be described with reference to the attached drawings.

Figure 1:
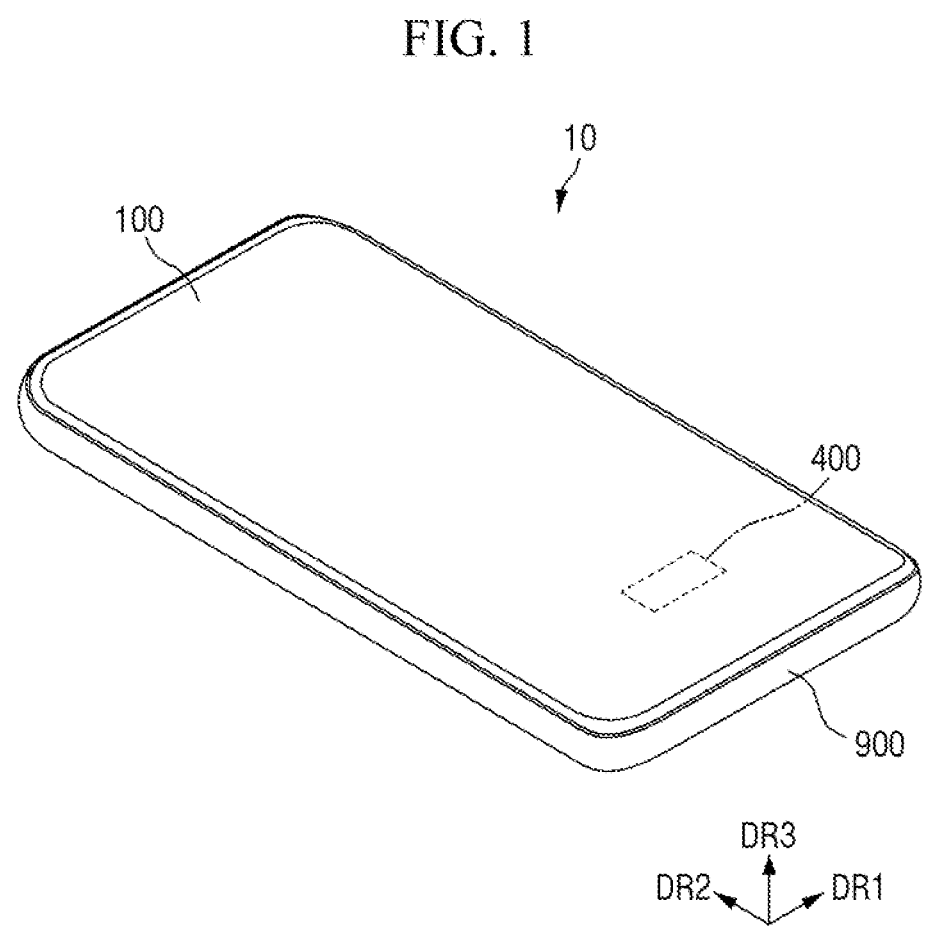

FIG. 1 is a perspective view of a display device according to an embodiment. FIG. 2 is an exploded perspective view of a display device according to an embodiment.

Referring to FIGS. 1 and 2, a display device 10 according to an embodiment can be incorporated into a portable electronic device such as a mobile phone, a smartphone, a tablet personal computer, a mobile communication terminal, an electronic organizer, an electronic book, a portable multimedia player (PMP), a navigation system, or an ultra mobile PC (UMPC), etc. Alternatively, the display device 10 according to an embodiment can be used as a display unit of a television, a laptop, a monitor, a billboard, or an Internet-of-Things (IoT) terminal. Alternatively, the display device 10 according to an embodiment can be incorporated into a wearable device such as a smart watch, a watch phone, a glasses type display, or a head mounted display (HMD). Alternatively, the display device 10 according to an embodiment can be incorporated into a dashboard of a vehicle, a center fascia of a vehicle, a center information display (CID) disposed on a dashboard of a vehicle, a room mirror display in place of side mirrors of a vehicle, or a display disposed on a rear surface of a front seat of a vehicle for rear seat entertainment.

In the present disclosure, a first direction DR1 is a short side direction of the display device 10, such as a horizontal direction of the display device 10. A second direction DR2 is a long side direction of the display device 10, such as a vertical direction of the display device 10. A third direction DR3 is a thickness direction of the display device 10 that is substantially normal to a plane defined by the first direction DR1 and the second direction DR2.

According to an embodiment, the display device 10 has a planar shape similar to a rectangle. For example, the display device 10 has a planar shape similar to a rectangle that has short sides in the first direction DR1 and long sides in the second direction DR2, as shown in FIG. 1. A corner where the short side in the first direction DR1 and the long side in the second direction DR2 meet may be right-angled or rounded with a predetermined curvature. The planar shape of the display device 10 is not limited to a rectangle, and may have, for example, a polygonal shape, a circular shape, or an elliptical shape.

According to an embodiment, the display device 10 is flat. Alternatively, according to an embodiment, the display device 10 has bendable two sides that face each other. For example, the display device 10 may have bendable left and right sides. Alternatively, according to an embodiment, the display device 10 has bendable upper, lower, left, and right sides.

The display device 10 according to an embodiment includes a cover window 100, a display panel 300, a display circuit board 310, a display driving circuit 320, a fingerprint sensor 400, a bracket 600, a main circuit board 700, and a lower cover 900.

According to an embodiment, the cover window 100 is disposed above the display panel 300 and covers the front surface of the display panel 300. Accordingly, the cover window 100 can protect the top surface of the display panel 300.

According to an embodiment, the cover window 100 includes a light transmitting portion DA100 that corresponds to the display panel 300 and a light blocking portion NDA100 that corresponds to an area other than the display panel 300. The light blocking portion NDA100 is opaque. Alternatively, according to an embodiment, the light blocking portion NDA100 is a decorative layer that has a pattern that can be displayed to the user when an image is not displayed.

According to an embodiment, the display panel 300 is disposed below the cover window 100. The display panel 300 is a light emitting display panel that includes a light emitting element. For example, the display panel 300 is an organic light emitting display panel that uses an organic light emitting diode that includes an organic light emitting layer.

According to an embodiment, the display panel 300 includes a main region MA and a sub-region SBA.

According to an embodiment, the main region MA includes a display area DA that displays an image and a non-display area NDA that is a peripheral area of the display area DA. The display area DA includes display pixels SP, shown in FIG. 3, that display an image. The non-display area NDA extends from the boundary of the display area DA to the edge of the display panel 300.

According to an embodiment, the display area DA includes a fingerprint sensing area. The fingerprint sensing area is where the fingerprint sensor 400 is disposed. The fingerprint sensing area a part of the display area DA, as shown in FIG. 2. The fingerprint sensor 400 may include, for example, an optical fingerprint sensor, an ultrasonic fingerprint sensor, or a capacitive fingerprint sensor. The following description is directed to a case where an ultrasonic fingerprint sensor is used as the fingerprint sensor 400, however, embodiments are not limited thereto.

According to an embodiment, a planar shape of the main region MA of the display panel 300 is rectangular. For example, the planar shape of the main region MA is rectangular with right-angled corners. However, embodiments of the present disclosure are not limited thereto, and the planar rectangular shape of the main region MA may have rounded corners.

According to an embodiment, the sub-region SBA protrudes from one side of the main region MA in the second direction DR2. The length of the sub-region SBA in the first direction DR1 is less than the length of the main region MA in the first direction DR1, and the length of the sub-region SBA in the second direction DR2 is less than the length of the main region MA in the second direction DR2, but embodiments of the present disclosure are not limited thereto.

Although FIG. 2 shows that the sub-region SBA is unfolded, the sub-region SBA may be bent and, in this case, arranged on the bottom surface of the display panel 300. When the sub-region SBA is bent, it overlaps the main region MA of the substrate SUB. The display circuit board 310 and the display driving circuit 320 are disposed in the sub-region SBA.

According to an embodiment, the display circuit board 310 is attached to one end of the sub-region SBA of the display panel 300 with a conductive adhesive member such as an anisotropic conductive film. As a consequence, the display circuit board 310 is electrically connected to the display panel 300 and the display driving circuit 320. The display panel 300 and the display driving circuit 320 receive digital video data, timing signals, and driving voltages via the display circuit board 310. The display circuit board 310 may be, for example, a flexible printed circuit board, a printed circuit board, or a flexible film such as a chip on film.

According to an embodiment, the display driving circuit 320 generates signals and voltages that drive the display panel 300. The display driving circuit 320 is an integrated circuit (IC) that is attached to the sub-region SBA of the display panel 300 by, for example, one of a chip on glass (COG) method, a chip on plastic (COP) method, or an ultrasonic bonding method, but embodiments of the present disclosure are not limited thereto. For example, the display driving circuit 320 can be attached to the display circuit board 310 by a chip on film (COF) method.

According to an embodiment, a touch driving circuit 330 is disposed on the display circuit board 310. The touch driving circuit 330 is an integrated circuit and attached to the top surface of the display circuit board 310.

Further, a power supply unit may be additionally disposed on the display circuit board 310 to supply display driving voltages that drive the display driving circuit 320.

According to an embodiment, the fingerprint sensor 400 is disposed on the bottom surface of the display panel 300. The fingerprint sensor 400 is attached to the bottom surface of the display panel 300 using a fifth bonding member to be described below.

According to an embodiment, the bracket 600 is disposed under the display panel 300. The bracket 600 may include plastic, metal, or both plastic and metal. A first camera hole CMH1 into which a first camera sensor 720 is inserted, a battery hole BH in which a battery is disposed, and a cable hole CAH through which a cable 314 connected to the display circuit board 310 passes, are formed in the bracket 600.

According to an embodiment, the main circuit board 700 and a battery 790 are disposed under the bracket 600. The main circuit board 700 may be a printed circuit board or a flexible printed circuit board.

According to an embodiment, the main circuit board 700 includes a main processor 710, a first camera sensor 720, and a main connector 730. The first camera sensor 720 is disposed on both the top and bottom surfaces of the main circuit board 700, the main processor 710 is disposed on the top surface of the main circuit board 700, and the main connector 730 is disposed on the bottom surface of the main circuit board 700.

According to an embodiment, the main processor 710 controls all functions of the display device 10. For example, the main processor 710 outputs digital video data to the display driving circuit 320 through the display circuit board 310 such that the display panel 300 displays an image. Further, the main processor 710 receives touch data from the touch driving circuit 330 and determines the user's touch coordinates, and then executes an application associated with an icon displayed at the user's touch coordinates. Furthermore, the main processor 710 converts first image data received from the first camera sensor 720 into digital video data and outputs it to the display driving circuit 320 through the display circuit board 310, thereby displaying an image captured by the first camera sensor 720 on the display panel 300.

According to an embodiment, the first camera sensor 720 processes an image frame of a still image or a video obtained by the image sensor and outputs it to the main processor 710. The first camera sensor 720 may be a complementary metal-oxide-semiconductor (CMOS) image sensor or a charge-coupled device (CCD) sensor. The first camera sensor 720 is externally exposed through the bottom surface of the lower cover 900 by a second camera hole CMH2 to thereby capture an image of a background or an object disposed below the display device 10.

According to an embodiment, the cable 314 that passes through the cable hole CAH of the bracket 600 is connected to the main connector 730. Thus, the main circuit board 700 is electrically connected to the display circuit board 310.

According to an embodiment, the battery 790 is disposed so as not to overlap the main circuit board 700. The battery 790 overlaps the battery hole BH of the bracket 600. In addition, the fingerprint sensor 400 also overlaps the battery hole BH of the bracket 600.

In addition, the main circuit board 700 may be further equipped with a mobile communication module that can transmit and receive radio signals with at least one of a base station, an external terminal, or a server in a mobile communication network. The radio signal may include various types of data based on transmission and reception of a voice signal, a video call signal, or a text/multimedia message.

According to an embodiment, the lower cover 900 is disposed below the main circuit board 700 and the battery 790. The lower cover 900 is fixed by being fastened to the bracket 600. The lower cover 900 provides an external appearance of the bottom surface of the display device 10. The lower cover 900 may include plastic, metal, or both plastic and metal.

According to an embodiment, the second camera hole CMH2 exposes the bottom surface of the first camera sensor 720 and is formed in the lower cover 900. The position of the first camera sensor 720 and the positions of the first and second camera holes CMH1 and CMH2 that correspond to the first camera sensor 720 are not limited to an embodiment illustrated in FIG. 2.

Figure 3:
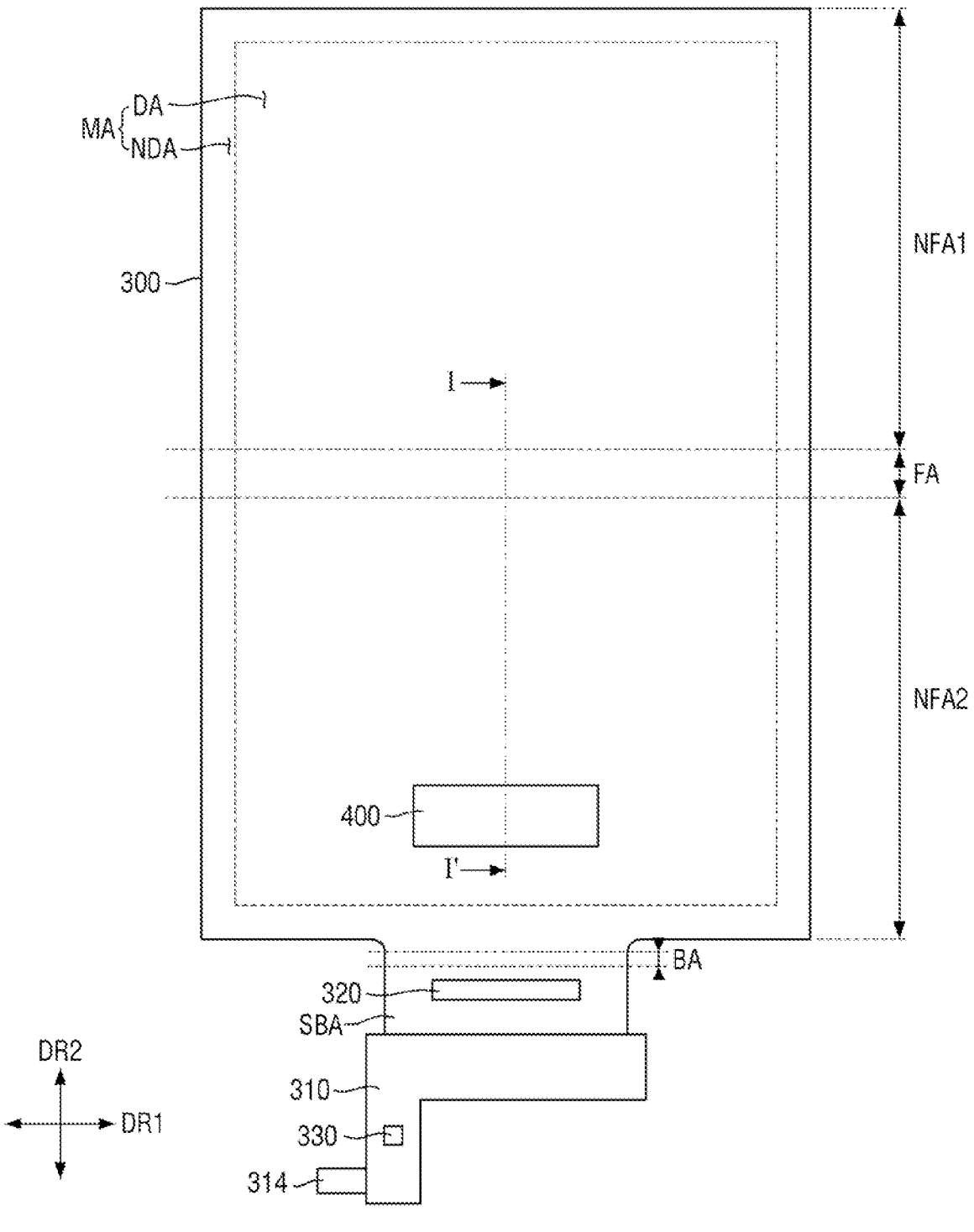
FIG. 3 is a plan view of a display panel, a display circuit board, and a display driving circuit of FIG. 2.

FIG. 3 is a plan view of a display panel, a display circuit board, and a display driving circuit of FIG. 2.

Referring to FIG. 3, according to an embodiment, the display device further includes a foldable area FA and non-foldable areas NFA1 and NFA2. The foldable area FA has a linear shape that extends along the first direction DR1. The first non-foldable area NFA1 is located on one side of the foldable area FA in the second direction DR2, and the second non-foldable area NFA2 is located on the other side of the foldable area FA in the second direction DR2. The area of each of the non-foldable areas NFA1 and NFA2 may be larger than the area of the foldable area FA, but embodiments are not limited thereto.

A display device according to an embodiment is a foldable display device that can be folded and unfolded with respect to the foldable area FA when the non-foldable areas NFA1 and NFA2 are unfolded. The display device may be an infoldable display device which is in-folded such that the top surface of the first non-foldable area NFA1 of the display device faces the top surface of the second non-foldable area NFA2 of the display device with respect to the foldable area FA, or an out-foldable display device which is out-folded such that the bottom surface of the first non-foldable area NFA1 of the display device faces the bottom surface of the second non-foldable area NFA2 of the display device with respect to the foldable area FA.

According to an embodiment, the fingerprint sensor 400 is disposed in the second non-foldable area NFA2, as illustrated in FIG. 3. However, embodiments of the present disclosure are not limited thereto, and the fingerprint sensor 400 may be disposed in the first non-foldable area NFA1 or in the foldable area FA.

Figure 4:
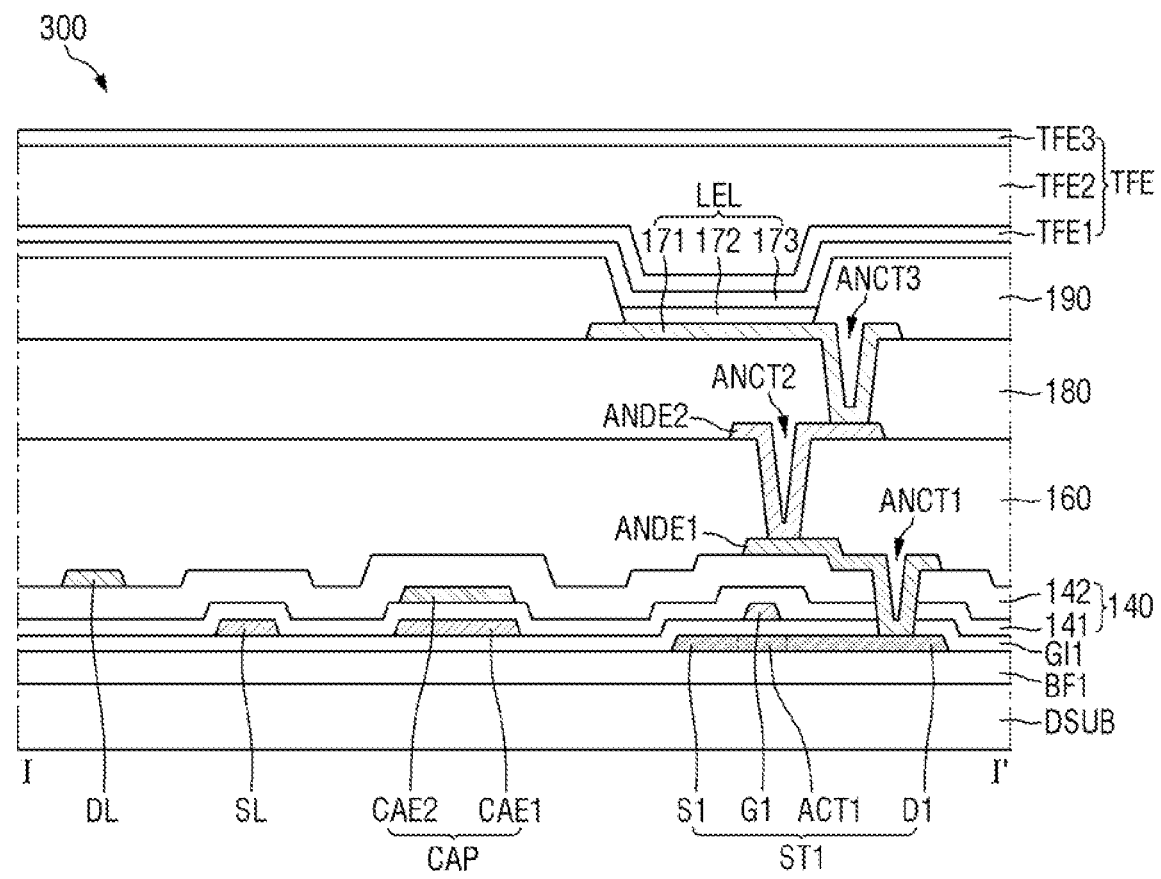
FIG. 4 is a cross-sectional view of the display panel of FIG. 3.

FIG. 4 is a cross-sectional view of the display panel of FIG. 3.

Referring to FIG. 4, according to an embodiment, the display panel 300 includes display pixels that display an image. Each of the display pixels SP includes a light emitting element LEL, a first thin film transistor ST1, and a capacitor CAP.

According to an embodiment, the display panel 300 includes a display substrate DSUB that is made of an insulating material such as glass, or polymer resin. For example, the display substrate DSUB includes polyimide. The display substrate DSUB is a flexible substrate which can be bent, folded or rolled.

According to an embodiment, the display substrate DSUB includes, for example, a plurality of organic layers and a plurality of inorganic layers. For example, the display substrate DSUB includes a first organic layer, a first barrier layer disposed on the first organic layer and that includes at least one inorganic layer, a second organic layer disposed on the first barrier layer, and a second barrier layer disposed on the second organic layer and that includes at least one inorganic layer.

According to an embodiment, a first buffer layer BF1 is disposed on the display substrate DSUB. The first buffer layer BF1 protects the thin film transistors of the first thin film transistor ST1 and a light emitting layer 172 of the light emitting element LEL from moisture that permeates through the display substrate DSUB, which is susceptible to moisture permeation. The first buffer layer BF1 is formed of a plurality of inorganic layers that are alternately stacked. For example, the first buffer layer BF1 may be formed of multiple layers in which one or more inorganic layers, such as a silicon nitride layer, a silicon oxynitride layer, a silicon oxide layer, a titanium oxide layer and an aluminum oxide layer, are alternately stacked.

According to an embodiment, a first active layer ACT1, a first source electrode S1, and a first drain electrode D1 of the first thin film transistor ST1 is disposed on the first buffer layer BF1. The first active layer ACT1 of the first thin film transistor ST1 includes one or more of polycrystalline silicon, monocrystalline silicon, low-temperature polycrystalline silicon, amorphous silicon, or an oxide semiconductor. The first source electrode S1 and the first drain electrode D1 are made conductive by doping a silicon semiconductor or an oxide semiconductor with ions or impurities. The first active layer ACT1 overlaps a first gate electrode G1, and the first source electrode S1 and the first drain electrode D1 do not overlap the first gate electrode G1.

According to an embodiment, a first gate insulating layer GI1 is disposed on the first buffer layer BF1 and the first active layer ACT1 of the first thin film transistor ST1. The first gate insulating layer GI1 is formed of an inorganic layer, such as a silicon nitride layer, a silicon oxynitride layer, a silicon oxide layer, a titanium oxide layer, or an aluminum oxide layer.

According to an embodiment, a scan line SL, a first capacitor electrode CAE1, and the first gate electrode G1 of the first thin film transistor ST1 are disposed on the first gate insulating layer GI1. The first gate electrode G1 overlaps the first active layer ACT1. The scan line SL is electrically connected to the first gate electrode G1. The first capacitor electrode CAE1 overlaps a second capacitor electrode CAE2. The first gate electrode G1 and the scan line SL may be formed as a single layer or as multiple layers that include any one of molybdenum (Mo), aluminum (Al), chromium (Cr), gold (Au), titanium (Ti), nickel (Ni), neodymium (Nd) or copper (Cu), or an alloy thereof.

According to an embodiment, a first interlayer insulating layer 141 is disposed on the first gate insulating layer GI1, the first gate electrode G1, the first capacitor electrode CAE1, and the scan line SL. The first interlayer insulating layer 141 is formed of an inorganic layer, for example, a silicon nitride layer, a silicon oxynitride layer, a silicon oxide layer, a titanium oxide layer, or an aluminum oxide layer.

According to an embodiment, the second capacitor electrode CAE2 is disposed on the first interlayer insulating layer 141. The first interlayer insulating layer 141 is disposed between the first and second capacitor electrodes CAE1 and CAE2. Because the first interlayer insulating layer 141 has a predetermined dielectric constant, a capacitor CAP is formed by the first and second capacitor electrodes CAE1 and CAE2 and the first interlayer insulating layer 141. The second capacitor electrode CAE2 may be formed as a single layer or as multiple layers that include any one of molybdenum (Mo), aluminum (Al), chromium (Cr), gold (Au), titanium (Ti), nickel (Ni), neodymium (Nd) or copper (Cu), or an alloy thereof.

According to an embodiment, a second interlayer insulating layer 142 is disposed on the first interlayer insulating layer 141 and the second capacitor electrode CAE2. The second interlayer insulating layer 142 is formed of an inorganic layer, such as a silicon nitride layer, a silicon oxynitride layer, a silicon oxide layer, a titanium oxide layer, or an aluminum oxide layer. The second interlayer insulating layer 142 may include a plurality of inorganic layers.

According to an embodiment, a first pixel connection electrode ANDE1 and a data line DL are disposed on the second interlayer insulating layer 142. The first pixel connection electrode ANDE1 penetrates the first gate insulating layer GI1 the first interlayer insulating layer 141 and the second interlayer insulating layer 142 through a first pixel contact hole ANCT1 and connects to the first drain electrode D1 of the first thin film transistor ST1 that is exposed by the first pixel contact hole ANCT1. The first pixel connection electrode ANDE1 may be formed as a single layer or as multiple layers that include any one of molybdenum (Mo), aluminum (Al), chromium (Cr), gold (Au), titanium (Ti), nickel (Ni), neodymium (Nd) or copper (Cu), or an alloy thereof.

According to an embodiment, a first organic layer 160 is disposed on the first pixel connection electrode ANDE1, the data line DL, and the the second interlayer insulating layer 142. The first organic layer 160 has a planarized upper surface. The first organic layer 160 may be formed of acryl resin, epoxy resin, phenolic resin, polyamide resin, or polyimide resin, etc.

According to an embodiment, a second pixel connection electrode ANDE2 is disposed on the first organic layer 160. The second pixel connection electrode ANDE2 connects to the first pixel connection electrode ANDE1 through a second pixel contact hole ANCT2 that penetrates the first organic layer 160 and exposes the first pixel connection electrode ANDE1. The second pixel connection electrode ANDE2 may be formed as a single layer or as multiple layers that include any one of molybdenum (Mo), aluminum (Al), chromium (Cr), gold (Au), titanium (Ti), nickel (Ni), neodymium (Nd) or copper (Cu), or an alloy thereof.

According to an embodiment, a second organic layer 180 is disposed on the first organic layer 160 and the second pixel connection electrode ANDE2. The second organic layer 180 may be formed of acryl resin, epoxy resin, phenolic resin, polyamide resin, or polyimide resin, etc.

However, in an embodiment, the second pixel connection electrode ANDE2 and the second organic layer 180 can be omitted. In this case, the first pixel connection electrode ANDE1 is directly connected to a light emitting pixel electrode 171.

Although FIG. 4 illustrates the first thin film transistor ST1 as being a top gate transistor in which the first gate electrode G1 is located above the first active layer ACT1, embodiments of the present disclosure are not limited thereto. The first thin film transistor ST1 may be a bottom gate transistor in which the first gate electrode G1 is located below the first active layer ACT1, or a double gate transistor in which gate electrodes are located both above and below the first active layer ACT1.

According to an embodiment, the light emitting elements LEL and a bank 190 are disposed on the second organic layer 180. Each of the light emitting elements LEL includes a light emitting pixel electrode 171, the light emitting layer 172, and a light emitting common electrode 173.

According to an embodiment, the light emitting pixel electrode 171 is formed on the second organic layer 180. The light emitting pixel electrode 171 connects to the second pixel connection electrode ANDE2 through a third pixel contact hole ANCT3 that penetrates the second organic layer 180 and exposes the second pixel connection electrode ANDE2.

According to an embodiment, in a top emission structure in which light is emitted toward the light emitting common electrode 173, the light emitting pixel electrode 171 is formed of a highly reflective metals in a stacked structure that may be aluminum and titanium (Ti/Al/Ti), aluminum and ITO (ITO/Al/ITO), an APC alloy, or a an APC alloy and ITO (ITO/APC/ITO). An APC alloy is an alloy of silver (Ag), palladium (Pd) and copper (Cu).

According to an embodiment, the bank 190 delimits the light emitting pixel electrode 171 on the second organic layer 180 to define an emission area. The bank 190 covers the edge of the light emitting pixel electrode 171. The bank 190 includes an organic layer such as acryl resin, epoxy resin, phenolic resin, polyamide resin, or polyimide resin, etc.

The emission area is where the light emitting pixel electrode 171, the light emitting layer 172, and the light emitting common electrode 173 are sequentially stacked such that the holes from the light emitting pixel electrode 171 and the electrons from the light emitting common electrode 173 combine with each other in the light emitting layer 172 and emit light.

According to an embodiment, the light emitting layer 172 is formed on the light emitting pixel electrode 171. The light emitting layer 172 includes an organic material to emit light of a predetermined color. For example, the light emitting layer 172 includes a hole transporting layer, an organic material layer, and an electron transporting layer.

According to an embodiment, the light emitting common electrode 173 is formed on the light emitting layer 172 and the bank 190. The light emitting common electrode 173 covers the light emitting layer 172. The light emitting common electrode 173 is formed in common on all emission areas. A capping layer may be formed on the light emitting common electrode 173.

In a top emission structure according to an embodiment, the light emitting common electrode 173 is formed of a light transmissive material such as a transparent conductive oxide (TCO) such as indium tin oxide (ITO) and indium zinc oxide (IZO), or a semi-transmissive conductive material such as magnesium (Mg), silver (Ag), or an alloy of magnesium (Mg) and silver (Ag).

According to an embodiment, an encapsulation layer TFE is disposed on the light emitting common electrode 173. The encapsulation layer TFE includes at least one inorganic layer that prevents oxygen or moisture from permeating into the light emitting element layer EML. In addition, the encapsulation layer TFE includes at least one organic layer that protects the light emitting element layer EML from foreign substances such as dust. For example, the encapsulation layer TFE includes a first inorganic encapsulation layer TFE1, an organic encapsulation layer TFE2, and a second inorganic encapsulation layer TFE3.

In an embodiment, the display panel 300 is illustrated as being an organic light emitting display panel that uses an organic light emitting diode, but embodiments are not limited thereto. According to embodiments, the display panel 300 may be a micro light emitting diode display panel that uses a micro LED, a quantum dot light emitting display panel that uses a quantum dot light emitting diode that includes a quantum dot light emitting layer, or an inorganic light emitting display panel that uses an inorganic light emitting element that includes an inorganic semiconductor.

Figure 5:
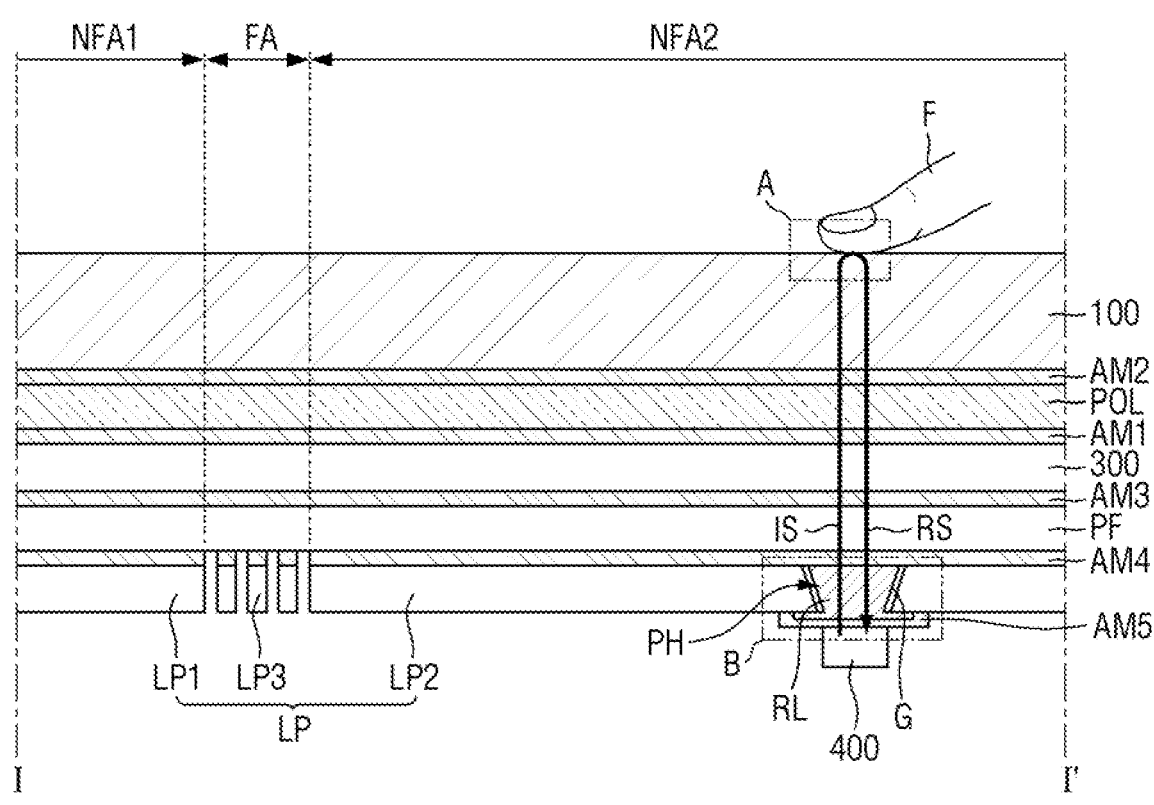
FIG. 5 is a cross-sectional view taken along line I-I' of FIG. 3.
Figure 6:
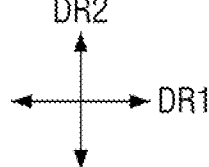
FIG. 6 is a plan view of a lower metal sheet and a filling member according to an embodiment.

FIG. 5 is a cross-sectional view taken along line I-I' of FIG. 3. FIG. 6 is a plan view of a lower metal sheet and a filling member according to an embodiment. FIG. 5 illustrates a user touching the top surface of the cover window 100 with a finger F for fingerprint authentication.

Referring to FIG. 5, according to an embodiment, the display device includes a polarization layer POL, the cover window 100, a metal plate LP, a filling member RL, and bonding members AM1 to AM5 that bond adjacent members. Of the bonding members AM1 to AM5, the first to fourth bonding members AM1 to AM4 are pressure sensitive adhesives (PSA), and the fifth bonding member AM5 is a transparent adhesive resin such as an optically clear resin (OCR). However, embodiments of the present disclosure are not limited thereto, and the first to fourth bonding members AM1 to AM4 may be optically clear resins (OCR) or optically clear adhesives (OCA), and the fifth bonding member AM5 may be a pressure sensitive adhesive (PSA), an optically clear adhesive (OCA), or a colored adhesive resin.

According to an embodiment, the polarization layer POL is disposed on the display panel 300. The polarization layer POL is adhered to the top surface of the display panel 300 through the first bonding member AM1. The polarization layer POL reduces reflection of external light incident through the cover window 100.

According to an embodiment, the cover window 100 is disposed on the top surface of the polarization layer POL. The cover window 100 is adhered to the top surface of the polarization layer POL through the second bonding member AM2. In some embodiments, the polarization layer POL is omitted. In some embodiments where the polarization layer POL is omitted, color filters are disposed between the cover window 100 and the display panel 300, and a black matrix is disposed between adjacent color filters.

According to an embodiment, a protective layer PF is disposed on the bottom surface of the display panel 300. The protective layer PF may include polyimide (PI), polyethylene terephthalate (PET), etc., but embodiments are not limited to the disclosed materials. The protective layer PF is adhered to the bottom surface of the display panel 300 through the third bonding member AM3.

When the display panel 300 according to an embodiment is a front emission type display panel, the light transmittance of the third bonding member AM3 is lower than the light transmittance of the first and second bonding members AM1 and AM2 described above, but embodiments of the present disclosure are not limited thereto.

According to an embodiment, the metal plate LP is disposed under the protective layer PF. The metal plate LP is adhered to the bottom surface of the protective layer PF through the fourth bonding member AM4. As shown in FIGS. 5 and 6, the metal plate LP includes a first metal plate LP1 disposed in the first non-foldable area NFA1, a second metal plate LP2 disposed in the second non-foldable area NFA2, and a third metal plate LP3 formed of a plurality of patterns disposed in the foldable area FA. The first and second metal plates LP1 and LP2 support the display panel 300 thereabove in the non-foldable areas NFA1 and NFA2, respectively. Each of the first and second metal plates LP1 and LP2 has a plate shape. The metal plate LP is made of a metal or a metal alloy. For example, the metal plate LP is made of an aluminum alloy, but embodiments are not limited thereto. In some embodiments, the third metal plate LP3 is omitted. In the drawing, the first to third metal plates LP1, LP2, and LP3 are shown as being spaced apart from each other, but embodiments of the present disclosure are not limited thereto, and the first to third metal plates LP1, LP2, and LP3 may be integrally formed and combined with each other.

According to an embodiment, a through hole PH is formed in the second metal plate LP2. The through hole PH is surrounded by the materials of the second metal plate LP2 in a plan view. The through hole PH completely penetrates the second metal plate LP2 in the thickness direction and extends from the top surface of the metal plate LP2 that faces the bottom surface of the display panel 300 to the bottom surface of the metal plate LP2 opposite to the top surface. The filling member RL is disposed in the through hole PH on a same layer as the second metal plate LP2. The filling member RL is completely surrounded by the second metal plate LP2 in a plan view. The filling member RL is bonded to the bottom surface of the protective layer PF through the fourth bonding member AM4 and is bonded to the fingerprint sensor 400 through the fifth bonding member AM5. The fourth bonding member AM4 is a member-protective layer bonding member that bonds the filling member RL to the protective layer PF. The fourth bonding member AM4 bonds the top surface of the filling member RL and the top surface of the second metal plate LP2 to the bottom surface of the protective layer PF.

According to an embodiment, the fifth bonding member AM5 may also be referred to as a member-sensor bonding member. The fingerprint sensor 400 overlaps the filling member RL. The fingerprint sensor 400 is bonded to the bottom surface of the filling member RL and the bottom surface of the second metal plate LP2 through the fifth bonding member AM5.

As shown in FIG. 5, according to an embodiment, the finger F includes a fingerprint that faces the cover window 100. The fingerprint of the finger F includes depressions and ridges. The depressions and ridges of the fingerprint are repeatedly formed. In at least one section of the repeated depressions and ridges that includes one depression and one ridge taken among, the ridge may be referred to as ridge RID and the depression may be referred to as valley VAL. The ridge RID of the fingerprint is closer to the cover window 100 than the valley VAL of the fingerprint. A method of operating the ultrasonic fingerprint sensor will be described in detail with reference to FIG. 7.

In some embodiments, separate layers are further disposed between the metal plate LP and the protective layer PF. The layers include at least one functional layer. The functional layer performs at least one of a heat dissipation function, an electromagnetic shielding function, a grounding function, a buffering function, a rigidity enhancing function, a supporting function, or a digitizing function.

Figure 7:
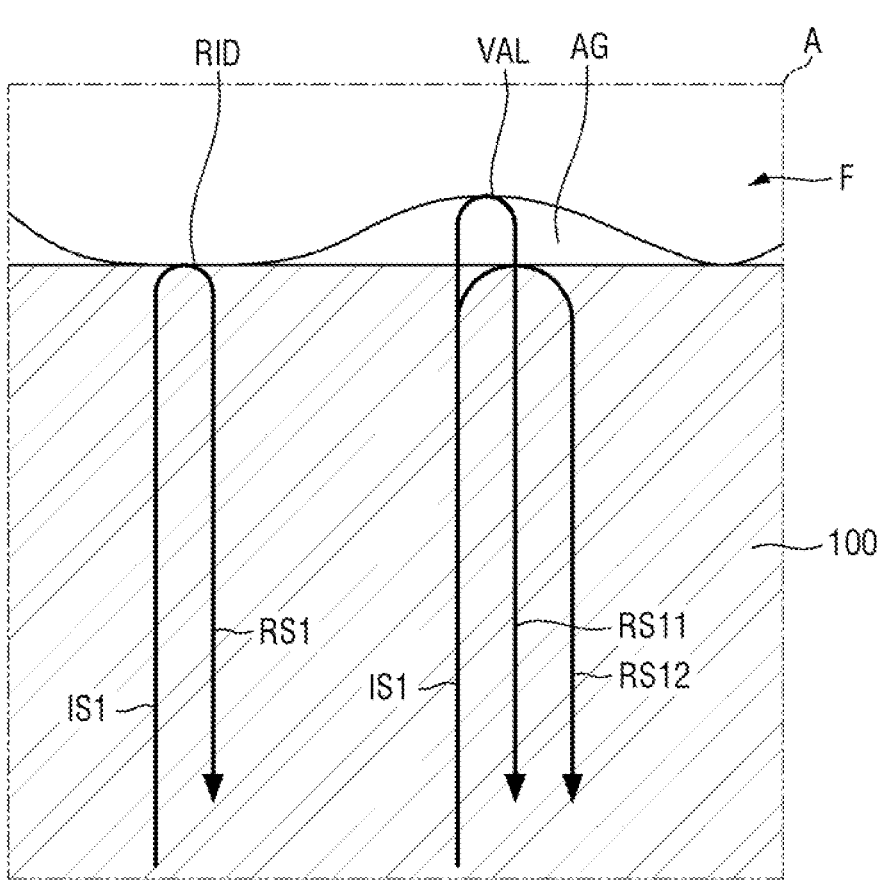
FIG. 7 is an enlarged cross-sectional view of area A of FIG. 5.

FIG. 7 is an enlarged cross-sectional view of area A of FIG. 5.

Referring to FIGS. 5 and 7, according to an embodiment, a first ultrasonic wave IS1 is irradiated to the ridge RID and the valley VAL of the fingerprint and then reflected by the ridge RID and the valley VAL. The first ultrasonic wave IS1 irradiated toward the ridge RID passes through the fifth bonding member AM5, the filling member RL, the fourth bonding member AM4, the protective layer PF, the third bonding member AM3, the display panel 300, the first bonding member AM1, the polarization layer POL, the second bonding member AM2, and the cover window 100 to reach the ridge RID. As shown in FIG. 5, because the ridge RID is in direct contact with the cover window 100, there is no gap, such as an air gap AG, between the ridge RID and the cover window 100. On the other hand, the first ultrasonic wave IS1 irradiated toward the valley VAL passes through the fifth bonding member AM5, the filling member RL, the fourth bonding member AM4, the protective layer PF, the third bonding member AM3, the display panel 300, the first bonding member AM1, the polarization layer POL, the second bonding member AM2, the cover window 100, and the air gap AG to reach the valley VAL. In this case, the first ultrasonic wave IS1 irradiated toward the valley VAL further passes through the air gap AG as compared to the first ultrasonic wave IS1 irradiated toward the ridge RID. The first ultrasonic wave IS1 irradiated to the ridge RID and reflected by the ridge RID is converted into a first signal RS1. Further, the first ultrasonic wave IS1 irradiated to the valley VAL and reflected by an interface between the air gap AG and the cover window 100 is converted into a first reflection signal RS11, and the first ultrasonic wave IS1 irradiated to the valley VAL and reflected by the valley VAL is converted into a second reflection signal RS12. The first and second reflection signals RS11 and RS12 constitute the first signal RS1. The magnitude of the first reflection signal RS11 is greater than that of the second reflection signal RS12.

According to an embodiment, the ultrasonic fingerprint sensor 400 recognizes the ridge RID and the valley VAL based on a first time difference between an emission time point of the first ultrasonic wave IS1 and an arrival time point of the first signal RS1 reflected by the ridge RID, and a second time difference between the emission time point of the first ultrasonic wave IS1 and an arrival time point of the first and second reflection signals RS11 and RS12 reflected by the valley VAL and the interface between the air gap AG and the cover window 100. However, given the existence of the air gap AG between the valley VAL and the cover window 100 and differences of the ultrasonic wave propagation speed with different mediums, it may challenging to distinguish between the ridge RID and the valley VAL.

According to an embodiment, a method that factors in the air gap AG between the valley VAL and the cover window 100 for more accurate distinction between the ridge RID and the valley VAL calculates a ratio between the strength of the first ultrasonic wave IS1 and the strength of the first signal RS1. The ratio of the strength of the first signal RS1 to the strength of the first ultrasonic wave IS1 is defined as a reflection coefficient R. In detail, the reflection coefficient of the first ultrasonic wave IS1 irradiated to the valley VAL is greater than the reflection coefficient of the first ultrasonic wave IS1 irradiated to the ridge RID. In other words, a ridge RID or valley VAL can be distinguished based on the reflection coefficient of the first ultrasonic wave IS1.

Referring back to FIG. 5, if the metal plate LP is disposed on the path of the first ultrasonic wave IS1 irradiated upward from the fingerprint sensor 400 or the first signal RS1 reflected from the fingerprint of the finger F, the signal strength of each of the first ultrasonic waves IS1 and the signal strength of the first signal RS1 may be reduced. In a display device according to an embodiment, the through hole PH that penetrates the metal plate LP is on the path of the first ultrasonic wave IS1 irradiated upward from the fingerprint sensor 400 or the first signal RS1 reflected from the fingerprint of the finger F.

In addition, when the fingerprint sensor 400 is directly attached to the protective layer PF through the fourth bonding member AM4 in the through hole PH, due to an attachment pressure, the display panel 300 and other components that overlap the fingerprint sensor 400 may be partially pressed in the upward direction, and the pressing may be visually recognized from the outside, causing a display failure. Furthermore, when the fingerprint sensor 400 is attached to the bottom surface of the second metal plate LP2 adjacent to the through hole PH, the first ultrasonic wave IS1 irradiated from the fingerprint sensor 400 may be subjected to signal distortion due to an air gap in the through hole PH.

Moreover, even if the bonding member fills up the through hole PH and bonds the bottom surface of the protective layer PF and the fingerprint sensor 400, the protective layer PF or the display panel 300 may be pressed due to an insufficient hardness of the bonding member.

In a display device according to an embodiment, the inside of the through hole PH is filled with the filling member RL, which has a much greater hardness than the fifth bonding member AM5, and the fingerprint sensor 400 is attached to the bottom surface of the filling member RL through the fifth bonding member AM5, thereby preventing defective pressing of the protective layer PF or the display panel 300, and preventing visual recognition of the through hole PH. To prevent defective pressing, the hardness of the filling member RL is at least 10 times the hardness of the fifth bonding member AM5. According to an embodiment, the hardness of the filling member RL is at least 20 times or 30 times the hardness of the fifth bonding member AM5. For example, the hardness of the filling member RL is 0.8 Gps or more, but embodiments are not limited thereto. The filling member RL includes materials well known in the art that can fill the through hole PH. For example, the filling member RL includes a material that can fill the through hole PH by an injection method or an adhesion method. According to an embodiment, the filling member RL is formed in the through hole PH through an injection method.

According to an embodiment, the filling member RL is made of acrylonitrile butadiene styrene copolymer (ABS), polycarbonate (PC), etc., but embodiments are not limited thereto. The hardness of the filling member RL is less than that of the adjacent second metal plate LP2.

Furthermore, according to an embodiment, the filling member RL is located in the path of the first ultrasonic wave IS1 irradiated from the fingerprint sensor 400, and the first ultrasonic wave IS1 is generally set to a frequency band which allows the ultrasonic wave to easily pass through the display panel 300. Therefore, to increase the sensing efficiency of the fingerprint sensor 400, the filling member RL has an impedance similar to that of the display panel 300. For example, the impedance of the filling member RL is set within an error of about $5$ MPa×m/s×$10^{-6}$ of the impedance of the display panel 300.

In some embodiments that use an ultrasonic fingerprint sensor, the filling member RL further includes a black colorant. Since the filling member RL further includes a black colorant, it is possible to prevent the fingerprint sensor 400 from being visually recognized from the outside.

According to an embodiment, when an optical fingerprint sensor is used as the fingerprint sensor 400, the filling member RL has the same hardness and material as the filling member RL used for an ultrasonic fingerprint sensor. However, since an optical fingerprint sensor recognizes a fingerprint through light, the filling member RL is designed in consideration of the transmittance of the corresponding light. When an optical fingerprint sensor is used, the filling member RL has a light transmittance of at least 90%. The light may include visible light, ultraviolet light, or infrared light.

In addition, the thermal expansion coefficient of the filling member RL and the thermal expansion coefficient of the second metal plate LP2 adjacent to the filling member RL according to an embodiment may be different. The thermal expansion coefficient of the filling member RL is greater than that of the second metal plate LP2, and is greater than or equal to about three times that of the second metal plate LP2. For example, the thermal expansion coefficient of the filling member RL made of polycarbonate (PC) is greater than about 75 ppm, and the thermal expansion coefficient of the second metal plate LP2 made of an aluminum alloy is about 17 ppm. In a high temperature environment where heat is supplied, the degree of volume expansion of the filling member RL that has a high thermal expansion coefficient is greater than that of the second metal plate LP2, which has a relatively low thermal expansion coefficient. In particular, when the filling member RL expands, the filling member RL tends to expand in the lateral direction, the upward direction, and the downward direction. In the lateral direction, the rigid second metal plate LP2 hinder the filling member RL from expanding laterally, and the bonding members AM4, AM3, AM1, and AM2, the protective layer PF, and the display panel 300, the polarization layer POL, and the cover window 100 hinder the filling member RL from expanding in an upward direction. Accordingly, the filling member RL expands in a downward direction, which is easier compared to the upward direction. The expansion of the filling member RL in the downward direction may cause an instability in the arrangement of the fingerprint sensor 400, which requires precise transmission and reception of the ultrasonic waves IS and RS.

In a display device according to an embodiment, by providing a separation space between the filling member RL and the second metal plate LP2 that allows the filling member RL to expand in the lateral direction, it is possible to reduce the instability of the fingerprint sensor 400 caused by the downward expansion of the filling member RL. Before describing the separation space between the filling member RL and the second metal plate LP2, the shapes of the filling member RL and the second metal plate LP2 will be described.

Figure 8:
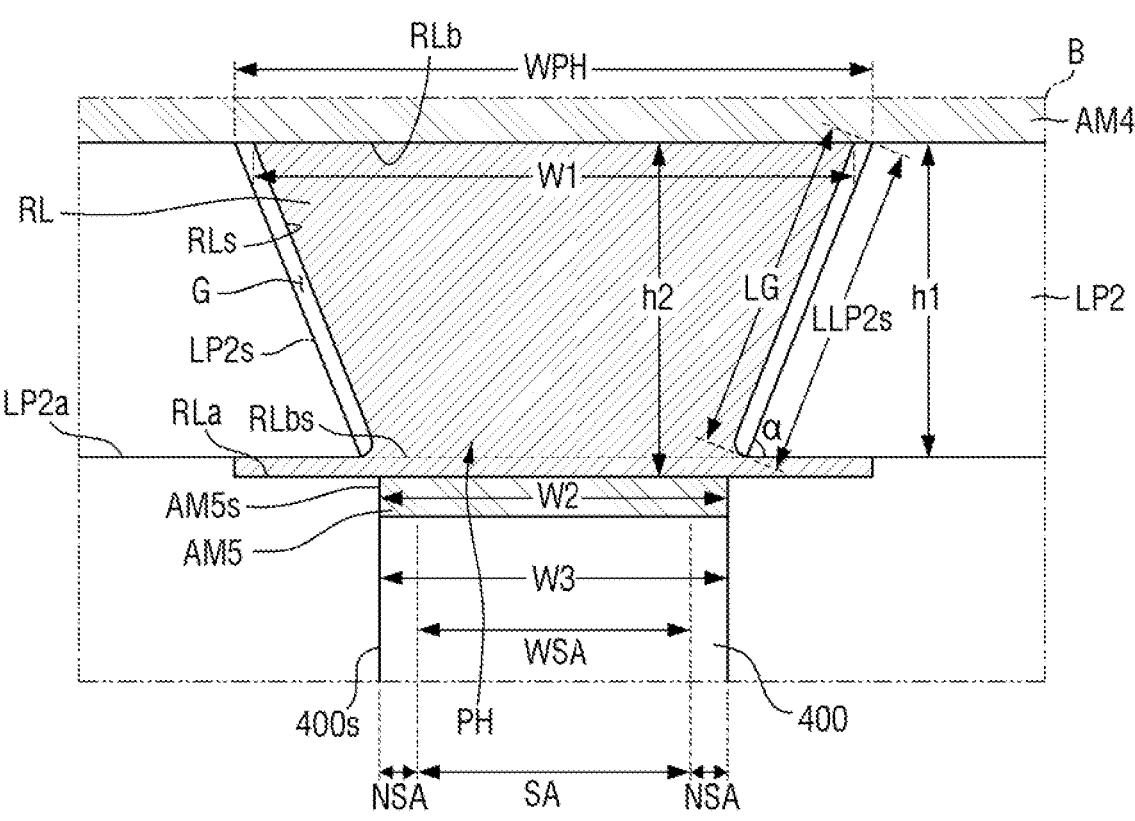
FIG. 8 is an enlarged cross-sectional view of area B of FIG. 5.

FIG. 8 is an enlarged cross-sectional view of area B of FIG. 5.

Referring to FIGS. 5 and 8, according to an embodiment, a side surface LP2s and a bottom surface LP2a of the second metal plate LP2 have a predetermined inclination angle α, and the inclination angle α is about 40° to 50°.

According to an embodiment, a top surface RLb of the filling member RL is in direct contact with the fourth bonding member AM4, and a bottom surface RLa of the filling member RL is in direct contact with the fifth bonding member AM5. A side surface RLs of the filling member RL is spaced apart from the side surfaces LP2s of the second metal plate LP2 with a separation space interposed therebetween. The separation space includes an air gap G. The air gap G is surrounded by the side surface LP2s of the second metal plate LP2, the side surface RLs of the filling member RL, and the fourth bonding member AM4.

According to an embodiment, the bottom surface RLa of the filling member RL protrudes downward from the bottom surface LP2a of the second metal plate LP2 through the through hole PH, and the filling member RL partially covers the bottom surface LP2a of the second metal plate LP2. In other words, the bottom surface RLa of the filling member RL is at a lower level that the bottom surface LP2a of the second metal plate LP2. In addition, a width of the filling member RL protruding through the through hole PH may be greater than a width W1 of the filling member RL positioned in the through hole PH. A thickness h2 of the filling member RL is greater than a thickness h1 of the second metal plate LP2 adjacent thereto. The width of the filling member RL protruding downward from the bottom surface LP2a of the second metal plate LP2 of the filling member RL may be larger than a maximum width WPH of the through hole PH.

According to an embodiment, the fifth bonding member AM5 is in contact with the top surface of the fingerprint sensor 400 and the bottom surface RLa of the filling member RL. The fifth bonding member AM5 overlaps the fingerprint sensor 400, and may have a width W2 equal to a width W3 of the fingerprint sensor 400, or may have a width W2 greater than the width W3 of the fingerprint sensor 400 but less than the minimum width of the through hole PH. When the width W2 of the fifth bonding member AM5 is equal to the width W3 of the fingerprint sensor 400, a side surface AM5s of the fifth bonding member AM5 is aligned with a side surface 400s of the fingerprint sensor 400 in the thickness direction.

However, embodiments are not limited to that shown in FIG. 8, and the fifth bonding member AM5 may be in direct contact with the entire bottom surface RLa of the filling member RL, the side surface of the filling member RL that protrudes downward from the bottom surface LP2a of the second metal plate LP2, and a part of the bottom surface LP2a of the second metal plate LP2. That is, the side surface AM5s of the fifth bonding member AM5 may be located outside the side surface of protruding portion of the filling member RL, and the width W2 of the fifth bonding member AM5 may be greater than the width W1 of the filling member RL. In an above-described embodiment, the fifth bonding member AM5 is in contact with the entire bottom surface RLa of the filling member RL and also is in contact with a part of the bottom surface LP2a of the second metal plate LP2. Accordingly, the second metal plate LP2 and the filling member RL are indirectly bonded through the fifth bonding member AM5. Thus, it is possible to prevent the filling member RL from escaping from the through hole PH, thereby enhancing the durability of the display device.

According to an embodiment, the fingerprint sensor 400 includes an active area SA in which sensors that transmit and receive ultrasonic waves are disposed, and an inactive area NSA in which no sensors are disposed. A minimum width of the filling member RL is greater than a width WSA of the active area SA. The width W3 of the fingerprint sensor 400 is less than the width W2 of the fifth bonding member AM5. The width W1 of the filling member RL is greater than the width W3 of the fingerprint sensor 400, but is not limited thereto.

As in an above-described embodiment, a structure in which the filling member RL partially covers and contacts the bottom surface of the second metal plate LP2 may be formed unintentionally when forming the filling member RL in the through hole PH in the second metal plate LP2, but embodiments are not limited thereto.

According to an embodiment, the width of the through hole PH of the second metal plate LP2 decreases from the top to the bottom, i.e., from the fourth bonding member AM4 toward the bottom surface LP2a of the metal plate LP. The cross-sectional shape of the through hole PH is an inverted trapezoid. The filling member RL has a cross-sectional shape similar to the cross-sectional shape of the through hole PH, and also has a shape in which the width W1 decreases from the top to the bottom in the through hole PH.

According to an embodiment, the size of the air gap G may vary depending on the injection pressure, the injection temperature, and the injection duration of an injection process of the filling member RL. Here, the size of the air gap G is expressed as a length LG of the air gap G in an extension direction of the side surface LP2s and a width (or thickness) in a direction perpendicular to the extension direction of the side surface.

In an injection process according to an embodiment of the filling member RL in the through hole PH, a mold is disposed on the upper portion of the through hole PH and the top surface of the second metal plate LP2, and a filling member material is injected into the through hole PH. In general, the higher the injection pressure, the higher the injection temperature, and the longer the injection duration, the greater will be the degree to which the filling member material fills the through hole PH. On the other hand, the lower the injection pressure, the lower the injection temperature, and the shorter the injection duration, the smaller will be the degree to which the filling member material fills the through hole PH. That is, the intended size of the air gap G is determined by adjusting the injection temperature, the injection pressure, and the injection duration. In particular, when the filling member RL contains a material having a high thermal expansion coefficient, the air gap G should have a larger size, and when the filling member RL contains a material having a low thermal expansion coefficient, the air gap G has a smaller size.

According to an embodiment, the length LG of the air gap G in the extension direction of the side surface of the second metal plate LP2 is 80% to 100% of a length LLP2s of the side surface LP2s of the second metal plate LP2. When the length LG of the air gap G is at least 80% of the length LLP2s, the air gap G has a minimum space that allows the filling member RL to expand in the lateral direction when the filling member RL thermally expands.

According to an embodiment, the thickness of the air gap G in a direction orthogonal to the extension direction of the side surface is constant along the extension direction of the side surface, but embodiments are not limited thereto.

Figure 9:
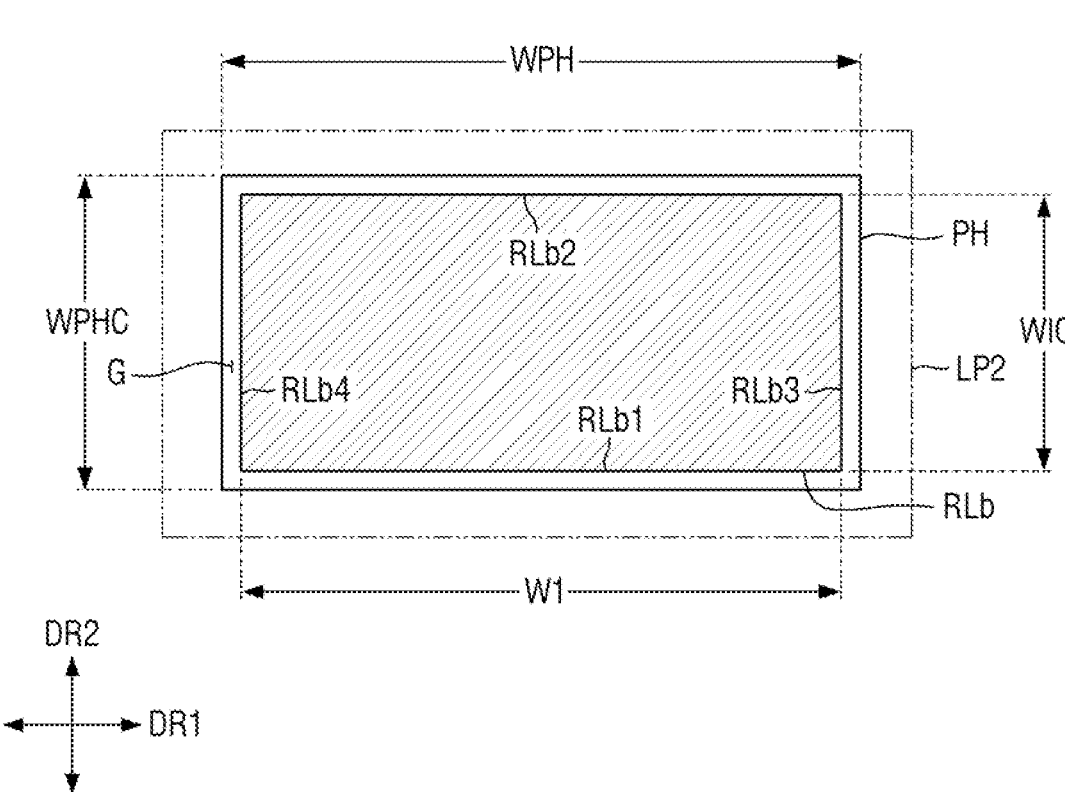
FIG. 9 is a schematic plan view of a filling member and a second metal plate according to an embodiment.
Figure 10:
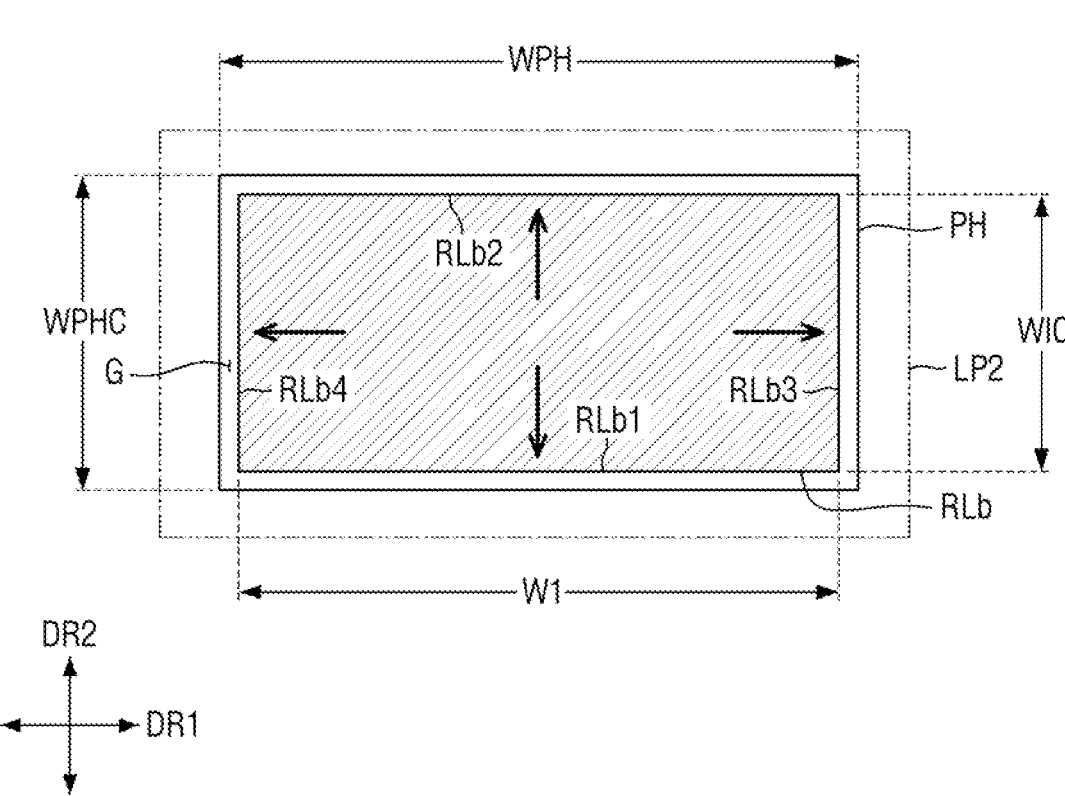
FIG. 10 is a schematic diagram of the structural deformation of the filling member that occurs due to thermal expansion of the filling member.
Figure 11:
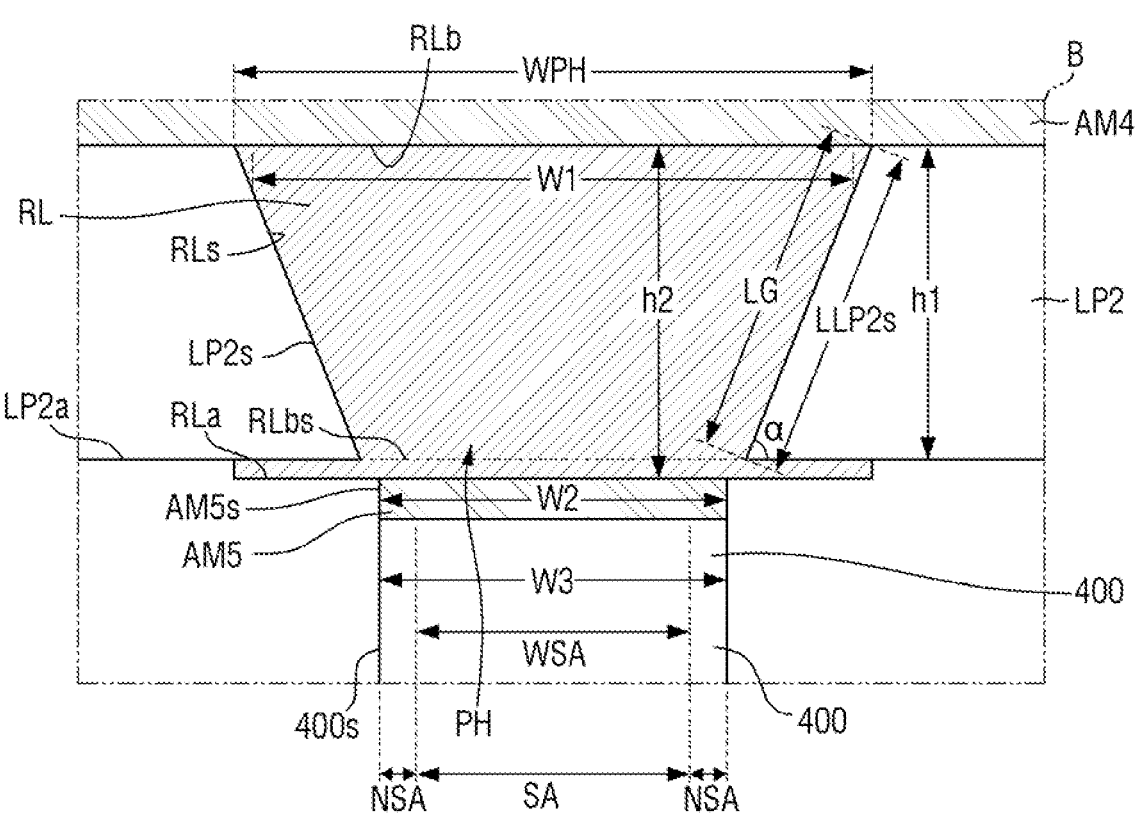
FIG. 11 is a cross-sectional view of structural deformation of the filling member that has occurred due to thermal expansion of the filling member.

FIG. 9 is a schematic plan view of a filling member and a second metal plate according to an embodiment. FIG. 10 is a schematic diagram of a structural deformation of the filling member that occurs due to thermal expansion of the filling member. FIG. 11 is a cross-sectional view illustrating a structural deformation of the filling member that has occurred due to thermal expansion of the filling member.

FIG. 9 is a plan view of the top surface RLb of the filling member RL and the top portion of the through hole PH of FIG. 8 when viewed from the top. Referring to FIGS. 9 to 11, according to an embodiment, the top portion of the through hole PH and the top surface RLb of the filling member RL have a similar shape, and have a rectangular shape in a plan view. However, the shape in a plan view is not limited thereto. For simplicity of description, a rectangular shape will be assumed.

According to an embodiment, the size of the top portion of the through hole PH in a plan view is larger than the size of the top surface RLb of the filling member RL in a plan view. The shape of the top portion of the through hole PH in a plan view includes long sides that extend along the first direction DR1 and short sides that extend along the second direction DR2. The shape of the top surface RLb of the filling member RL in a plan view includes long sides RLb1 and RLb2 that extend along the first direction DR1 and short sides RLb3 and RLb4 that extend along the second direction DR2. The long sides RLb1 and RLb2 and the short sides RLb3 and RLb4 are spaced apart from the long sides and the short sides of the top portion of the through hole PH with the air gap G therebetween. That is, one short side of the top portion of the through hole PH in the first direction DR1 and the other short side of the top portion of the through hole PH in the first direction DR1 are located outward from the short sides RLb3 and RLb4, respectively, and one long side of the top portion of the through hole PH in the second direction DR2 and the other long side of the top portion of the through hole PH in the second direction DR2 are located outward from the long sides RLb1 and RLb2, respectively. Accordingly, a width WPH of the long side of the top portion of the through hole PH is greater than the width W1 of the long side of the top surface RLb of the filling member RL, and a width WPHC of the short side of the top portion of the through hole PH is greater than a width W1C of the short side of the top surface RLb of the filling member RL.

Referring to FIG. 10, according to an embodiment, as described above, since the thermal expansion coefficient of the filling member RL is greater than the thermal expansion coefficient of the second metal plate LP2, in a high temperature environment where heat is supplied, the volume expansion of the filling member RL is greater than that of the second metal plate LP2.

In a display device according to an embodiment, by providing a separation space between the filling member RL and the second metal plate LP2 to allow the filling member RL to expand in the lateral directions, i.e. the first direction DR1 and the second direction DR2, when the filling member RL thermally expands, it is possible to reduce the instability of the fingerprint sensor 400 caused by the downward expansion of the filling member RL.

That is, according to an embodiment, in a high temperature environment where heat is supplied, the filling member RL expands in the lateral directions, and as a result, the side surface RLs of the filling member RL gradually expands toward and contacts the side surface LP2s of the second metal plate LP2. On the other hand, in a low temperature environment or a room temperature environment, the filling member RL contracts so that the side surface RLs of the filling member RL in contact with the side surface LP2s of the second metal plate LP2 gradually moves away from the side surface LP2s of the second metal plate LP2, thereby forming the air gap G of FIG. 8.

Hereinafter, modified examples of the cross-sectional shape of the filling member RL and the through hole PH will be described.

Figure 12:
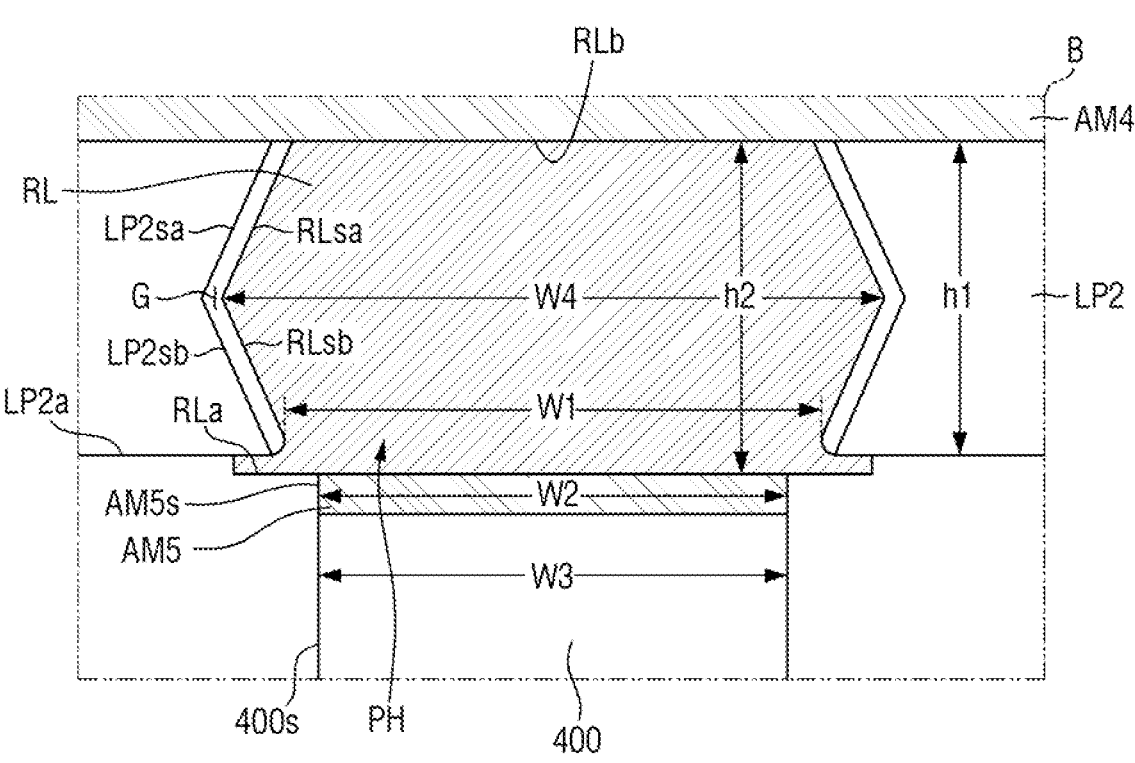
FIG. 12 is a cross-sectional view of a modified example of a filling member of FIG. 8.
Figure 13:
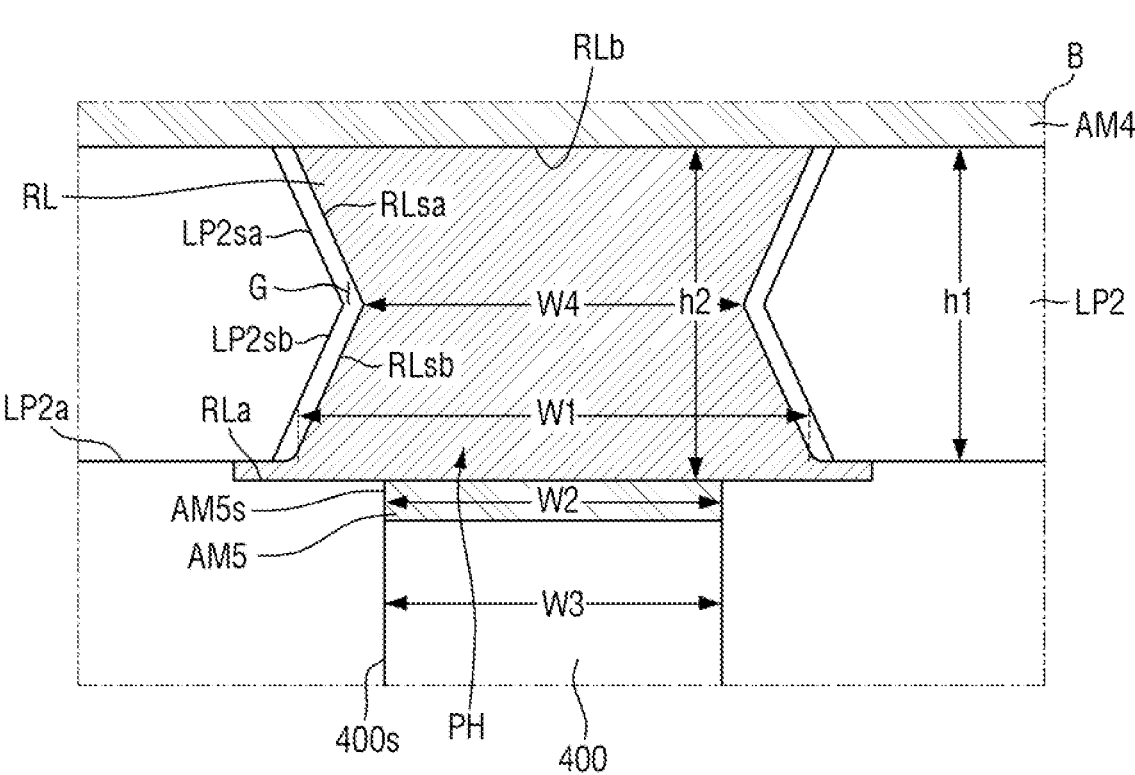
FIG. 13 is a cross-sectional view of a modified example of a filling member of FIG. 8.

FIG. 12 is a cross-sectional view of a modified example of a filling member of FIG. 8. FIG. 13 is a cross-sectional view of a modified example of a filling member of FIG. 8.

In the modified examples of the filling member RL of FIGS. 12 and 13, the width of the filling member RL varies differently in the thickness direction to prevent the filling member RL from escaping from the through hole PH.

Referring to FIG. 12, according to an embodiment, each of a width W1 of the top surface RLb of the filling member RL in contact with the fourth bonding member AM4 and a width W1 of the bottom surface RLa of the filling member RL in contact with the fifth bonding member AM5 is less than a width W4 of an intermediate surface positioned between the top surface RLb and the bottom surface RLa of the filling member RL. The intermediate surface is located at an intermediate point in the thickness direction between the top surface RLb and the bottom surface RLa.

According to an embodiment, an upper side surface RLsa of the filling member RL and a lower side surface RLsb of the filling member RL have different inclinations. The upper side surface RLsa of the filling member RL positioned on the left extends in a left-downward direction from a top surface RL3b thereof, and the lower side surface RLsb of the filling member RL positioned on the left extends in a left-upward direction from a bottom surface RL3a thereof. Similarly, the upper and lower side surfaces of the filling member RL positioned on the right extend in directions opposite to and symmetrical with those on the left. An upper side surface LP2sa and a lower side surface LP2sb of the second metal plate LP2 in contact therewith have shapes that correspond to the upper side surface RLsa and the lower side surface RLsb of the filling member RL facing them, respectively. In a present embodiment, the width of the through hole PH increases and then decreases from the top to the bottom.

On the other hand, according to an embodiment, in the filling member RL of FIG. 13, each of a width W1 of the top surface RLb of the filling member RL in contact with the fourth bonding member AM4 and a width W1 of the bottom surface RLa of the filling member RL in contact with the fifth bonding member AM5 is greater than a width W4 of an intermediate surface positioned between the top surface RLb and the bottom surface RLa of the filling member RL. The upper side surface RLsa of the filling member RL positioned on the left extends in a right-downward direction from a top surface RL3b thereof, and the lower side surface RLsb of the filling member RL positioned on the left extends in a right-upward direction from a bottom surface RL3a thereof. Similarly, the upper and lower side surfaces of the filling member RL positioned on the right extend in directions opposite to and symmetrical with those on the left. An upper side surface LP2sa and a lower side surface LP2sb of the second metal plate LP2 in contact therewith have shapes that correspond to the upper side surface RLsa and the lower side surface RLsb of the filling member RL facing them, respectively. In a present embodiment, the width of the through hole PH may decrease and then increase from the top to the bottom.

Figure 14:
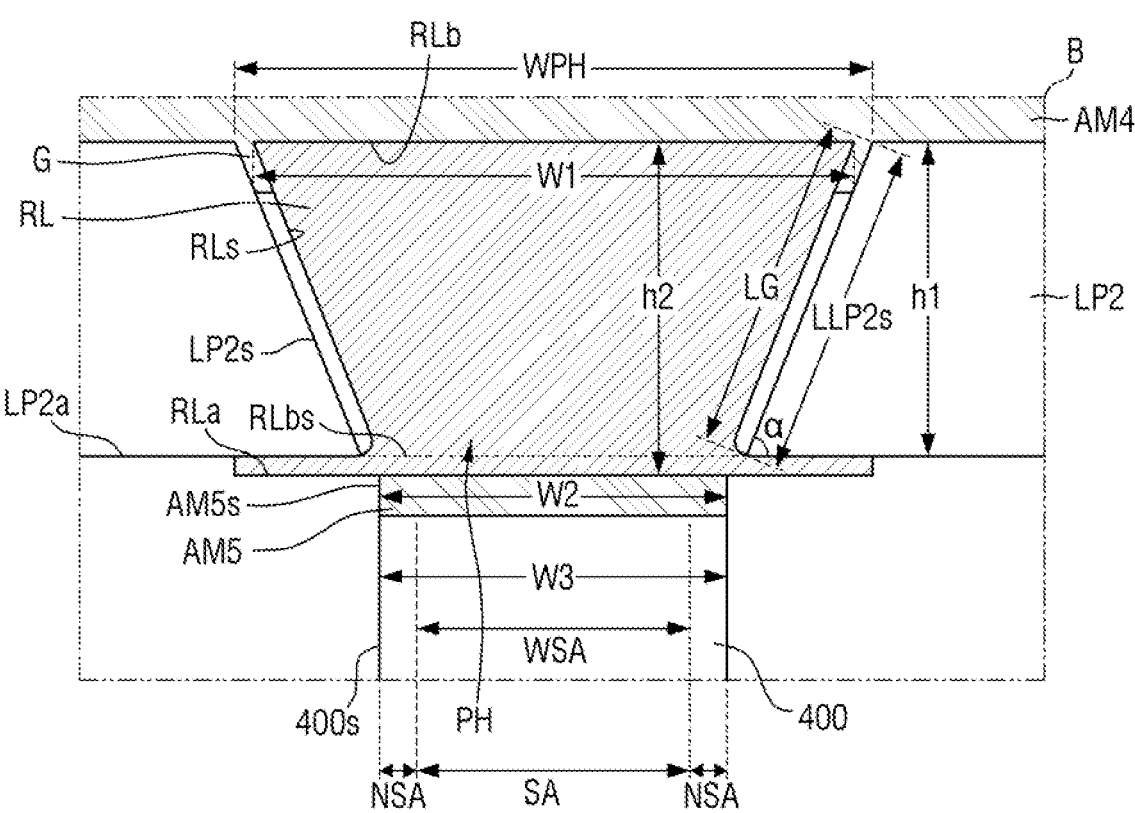
FIG. 14 is a partial cross-sectional view of a display device according to an embodiment.

FIG. 14 is a partial cross-sectional view of a display device according to another embodiment.

An embodiment of FIG. 14 differs from that of FIG. 8 in that a fourth bonding member AM4_1 partially fills a separation space between the side surface LP2s of the second metal plate LP2 and the side surface RLs of the filling member RL.

According to an embodiment, after filling the filling member RL in the through hole PH of the second metal plate LP2, the second metal plate LP2 and the filling member RL are bonded to the protective layer PF by the fourth bonding member AM4_1. Since the side surface LP2s of the second metal plate LP2 and the side surface RLs of the filling member RL are spaced apart from each other with a separation space therebetween, a part of the fourth bonding member AM4_1 may be interposed in the space.

According to a present embodiment, it is possible to increase a bonding force between the second metal plate LP2 and the filling member RL. An embodiment may form unintentionally when bonding the second metal plate LP2 and the filling member RL to the protective layer PF with the fourth bonding member AM4_1. However, without being limited thereto, an embodiment may form intentionally that increases the bonding force between the second metal plate LP2 and the filling member RL.

The following embodiments illustrate that the filling member and the second metal plate are adjacent to each other, and may directly contact each other or indirectly contact each other in that a gap or another member are interposed therebetween. The following embodiments show that to prevent a structural deformation due to differences in thermal expansion coefficients between the filling member and the second metal plate, a buffer member may be inserted into the separation space between the filling member and the second metal plate, or a free space may be formed in each inner space of the filling member or the second metal plate.

Figure 15:
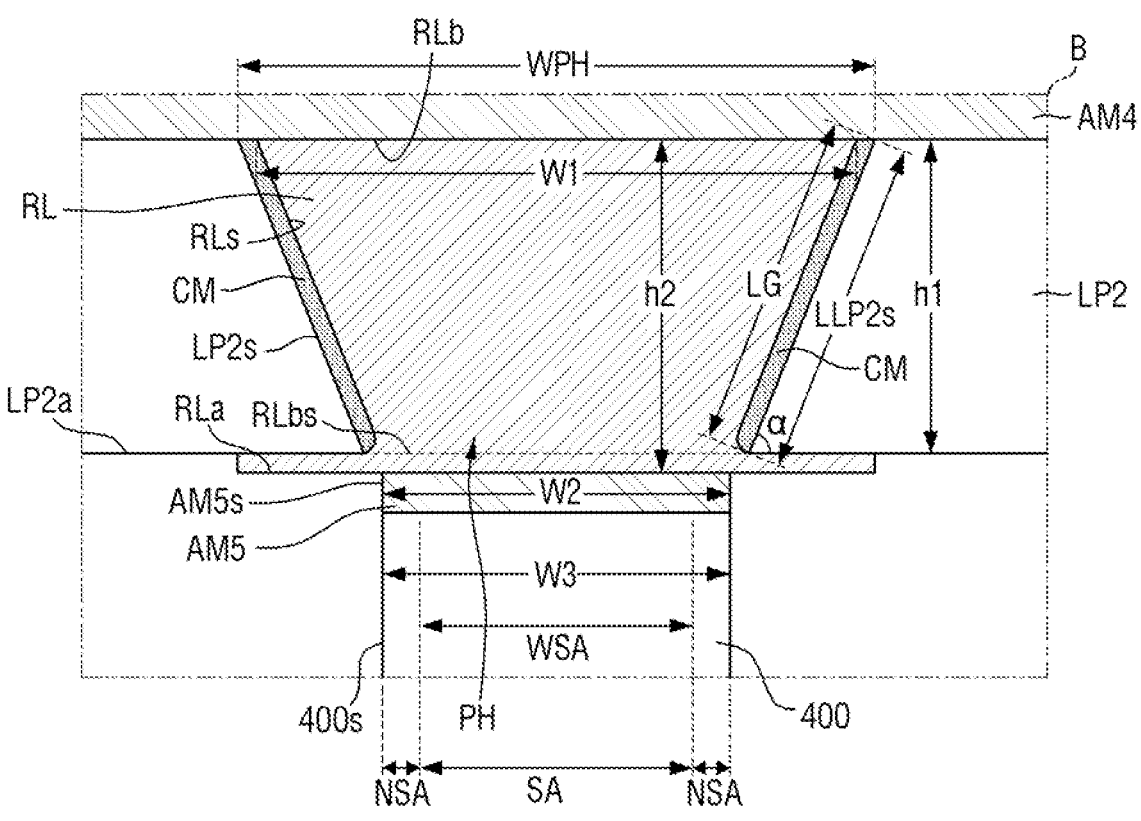
FIG. 15 is a partial cross-sectional view of a display device according to still another embodiment.

FIG. 15 is a partial cross-sectional view of a display device according to still another embodiment.

Referring to FIG. 15, according to an embodiment, in a display device according to a present embodiment, the filling member RL and the second metal plate LP2 are separated from each other by a buffer member CM, and indirectly contact each other.

More specifically, according to an embodiment, the buffer member CM is interposed between the side surface RLs of the filling member RL and the side surface LP2s of the second metal plate LP2, and the top surface thereof may be attached to the fourth bonding member AM4. The buffer member CM includes a material that is more flexible than the filling member RL and the second metal plate LP2, and has a lower thermal expansion coefficient than the filling member RL.

Figure 16:
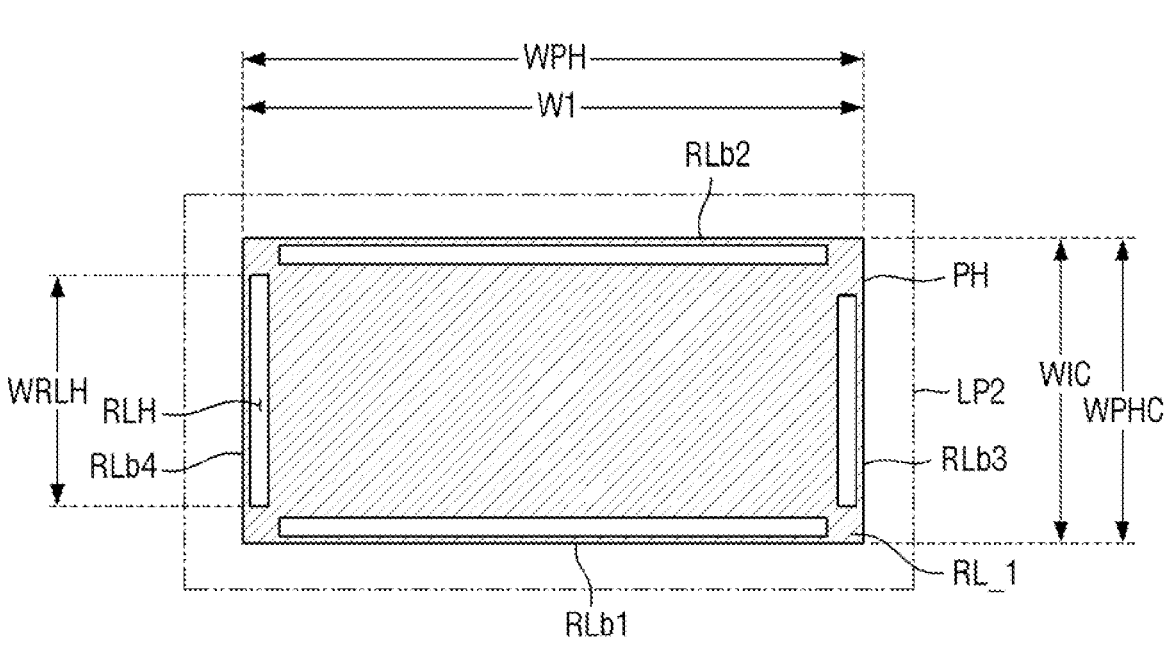
FIG. 16 is a schematic plan view of a filling member and a second metal plate according to an embodiment.
Figure 16:
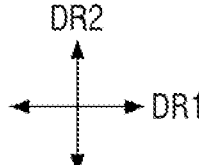
Figure 17:
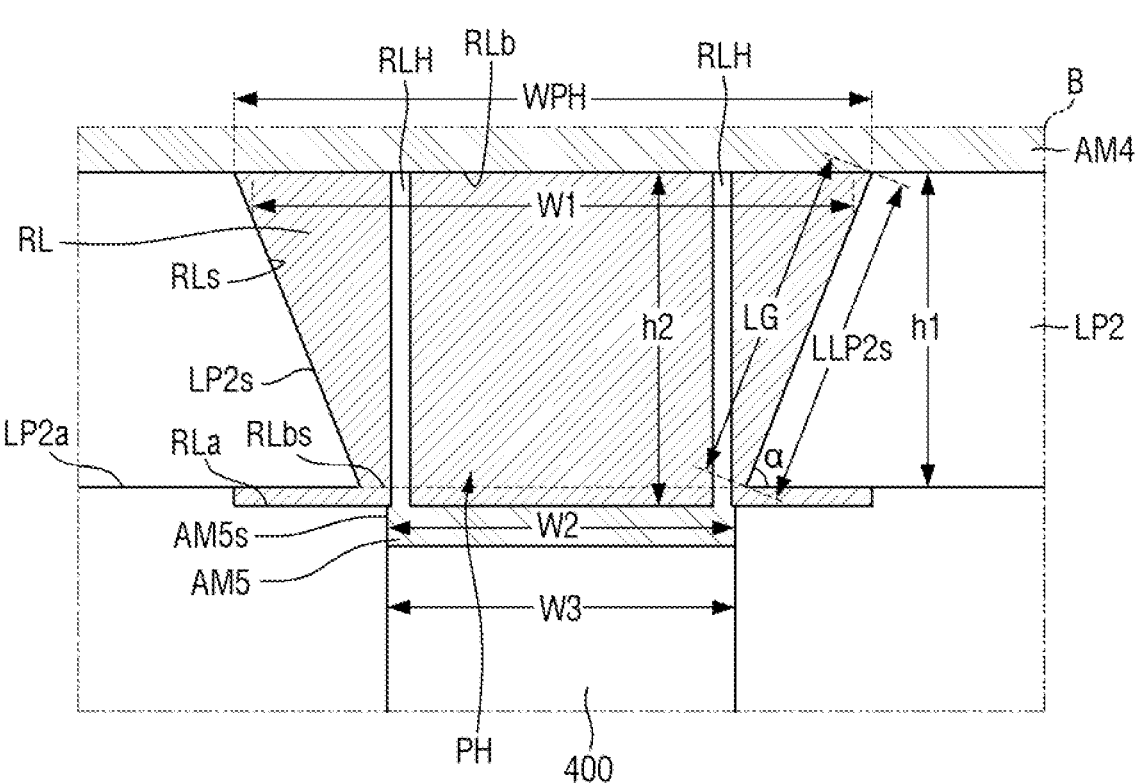
FIG. 17 is a partial cross-sectional view of a display device according to an embodiment.

FIG. 16 is a schematic plan view of a filling member and a second metal plate according to an embodiment. FIG. 17 is a partial cross-sectional view of a display device according to an embodiment. FIG. 16 is a plan view of a top surface RLb of a filling member RL_1 and the top portion of the through hole PH of FIG. 17 when viewed from the top.

In a display device of FIGS. 16 and 17, according to an embodiment, a side surface RLs of the filling member RL_1 and the side surface LP2s of the second metal plate LP2 are in direct contact with each other, and a free space is formed in the inner space of the filling member RL_1 to prevent structural deformation due to differences in thermal expansion coefficients between the filling member RL_1 and the second metal plate LP2.

In more detail, according to an embodiment, the filling member RL_1 further includes a member through hole RLH that penetrates the filling member RL_1 in the thickness direction. A plurality of member through holes RLH are formed, and the plurality of member through holes RLH are formed inside long sides RLb1 and RLb2 and short sides RLb3 and RLb3 of the filling member RL_1. For example, the plurality of member through holes RLH are adjacent to the short sides RLb3 and RLb3 on each side of the filling member RL_1 in the first direction DR1, and the plurality of member through holes RLH are adjacent to the long sides RLb1 and RLb2 on each side of the filling member RL_1 in the second direction DR2. Each member through hole RLH has a linear shape that extends along the extension direction of the adjacent respective side RLb1 to RLb4 of the filling member RL_1. An extension length WRLH of each member through hole RLH is less than the length W1, W1C of the adjacent respective side RLb1 to RLb4 of the filling member RL_1. Each member through hole RH is physically separated from the adjacent member through hole RH. However, embodiments of the present disclosure are not limited thereto, and some member through holes RH may be connected to adjacent member through holes RH, but not all member through holes RH are necessarily connected.

As shown in FIG. 17, according to an embodiment, the member through hole RH is located between the fingerprint sensor 400 and the second metal plate LP2, so as not to interfere with the ultrasonic waves IS and RS transmitted and received by the fingerprint sensor 400. FIG. 17 shows that the member through hole RLH extends vertically in the thickness direction, but the shape of the member through hole RH is not limited thereto as long as it does not interfere with the ultrasonic waves IS and RS transmitted and received by the fingerprint sensor 400.

Figure 18:
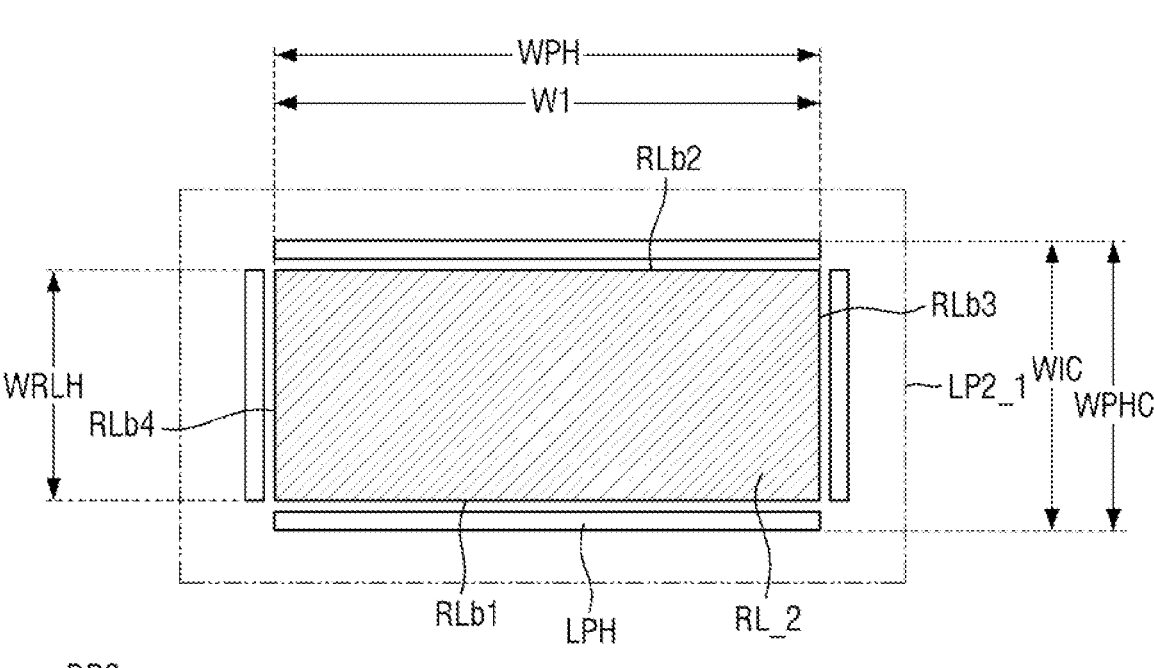
FIG. 18 is a schematic plan view of a filling member and a second metal plate according to an embodiment.
Figure 18:
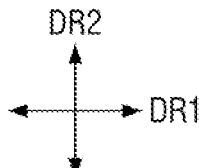
Figure 19:
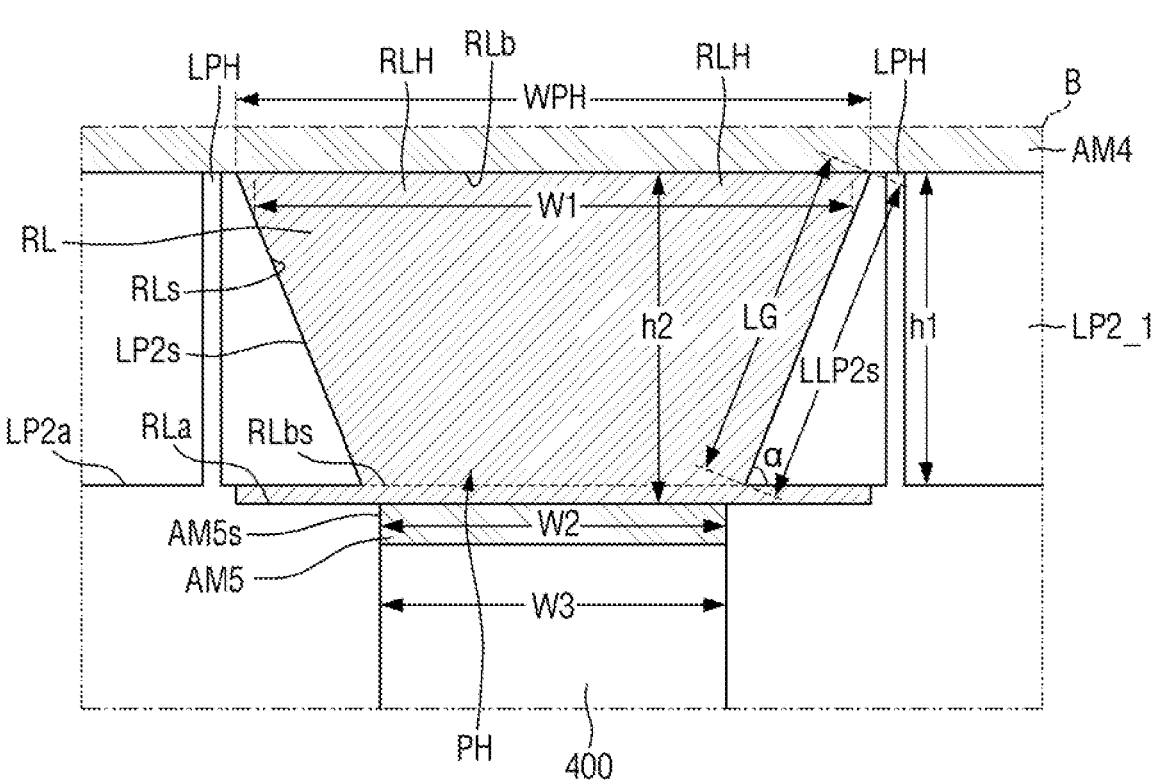
FIG. 19 is a partial cross-sectional view of a display device according to an embodiment.

FIG. 18 is a schematic plan view of a filling member and a second metal plate according to an embodiment. FIG. 19 is a partial cross-sectional view of a display device according to an embodiment.

FIG. 18 is a plan view of the top surface RLb of the filling member RL and the top portion of the through hole PH of FIG. 19 when viewed from the top.

In a display device of FIGS. 18 and 19, according to an embodiment, the side surface RLs of the filling member RL and a side surface LP2s of a second metal plate LP2_1 are in direct contact with each other, and a free space is formed in the inner space of the second metal plate LP2_1 to prevent structural deformation due to differences in thermal expansion coefficients between the filling member RL and the second metal plate LP2_1.

In more detail, according to an embodiment, the second metal plate LP2_1 further includes a plate through hole LPH that penetrates the second metal plate LP2_1 in the thickness direction. A plurality of plate through holes LPH are formed, and the plurality of plate through holes LPH are located outward from the long sides RLb1 and RLb2 and short sides RLb3 and RLb3 of the filling member RL. For example, the plurality of plate through holes LPH are adjacent to the short sides RLb3 and RLb3 on each side of the filling member RL in the first direction DR1, and the plurality of plate through holes LPH are adjacent to the long sides RLb1 and RLb2 on each side of the filling member RL in the second direction DR2. Each plate through hole LPH has a linear shape that extends along the extension direction of the adjacent respective side RLb1 to RLb4 of the filling member RL. An extension length WRLH of each plate through hole LPH is greater than the length of the adjacent respective side RLb1 to RLb4 of the filling member RL. However, embodiments are not limited thereto, and the extension length WPLH of each plate through hole LPH may be less than the length of the adjacent respective side RLb1 to RLb4 of the filling member RL.

According to an embodiment, each plate through hole LPH is physically separated from the adjacent plate through hole LPH. However, embodiments of the present disclosure are not limited thereto, and some plate through holes LPH may be connected to adjacent plate through holes LPH, but not all plate through holes LPH are necessarily connected.

Figure 20:
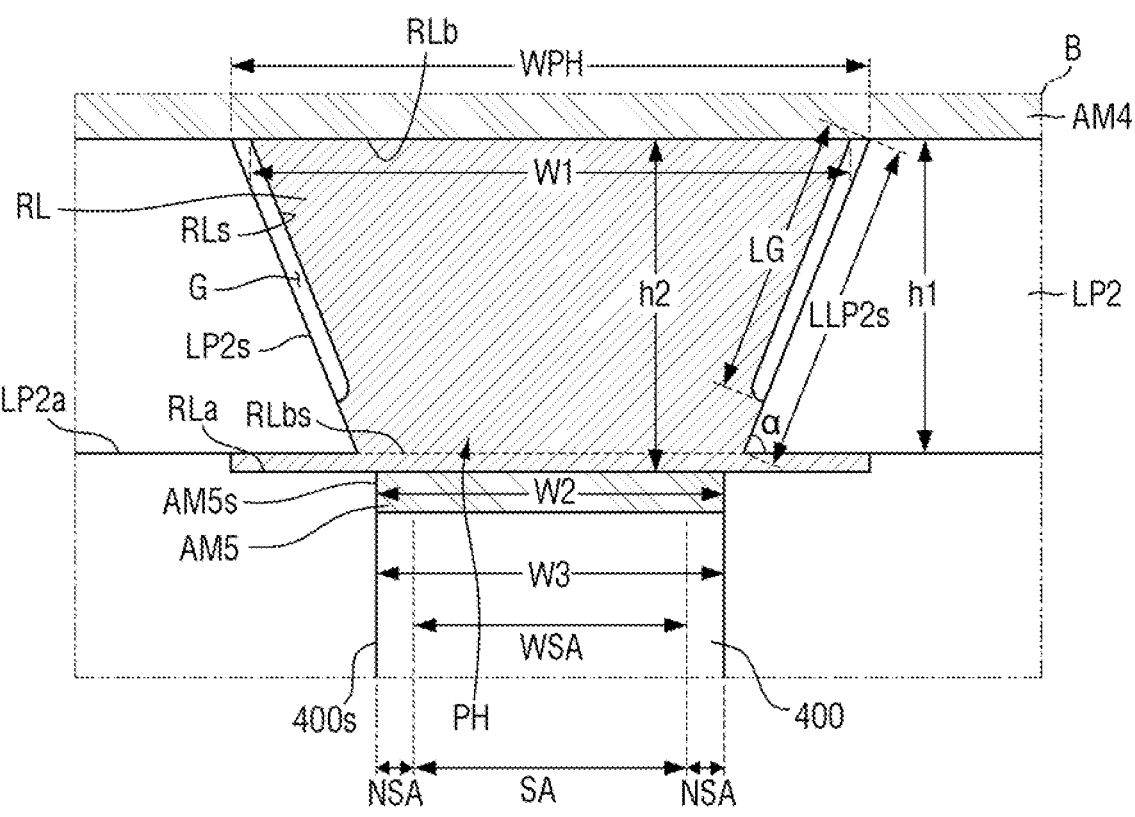
FIG. 20 is a partial cross-sectional view of a display device according to an embodiment.

FIG. 20 is a partial cross-sectional view of a display device according to an embodiment.

Referring to FIG. 20, in a display device according to a present embodiment, a part of the filling member RL comes in contact with the side surface LP2s of the second metal plate LP2, and the length LG of the air gap G in the extension direction of the side surface of the second metal plate LP2 is 80% to 100% of the length LLP2s of the side surface LP2s of the second metal plate LP2.

More specifically, according to an embodiment, a part of the filling member RL comes into contact with the lower end of the side surface LP2s of the second metal plate LP2, i.e., a portion connected to the bottom surface LP2a of the second metal plate LP2, so that the length LG of the air gap G in the extension direction of the side surface of the second metal plate LP2 is less than the length LG of the air gap G in the extension direction of the side surface of the second metal plate LP2 of FIG. 8. According to a present embodiment, since the length LG of the air gap G in the extension direction of the side surface of the second metal plate LP2 is less than the length LG of the air gap G in the extension direction of the side surface of the second metal plate LP2 of FIG. 8, the area (or size) of the air gap G itself decreases. Accordingly, although the area of the free space into which the filling member RL can expand due to heat may be reduced, since a part of the filling member RL comes into contact with the lower end of the side surface LP2s of the second metal plate LP2, the filling member RL is supported by the second metal plate LP2 therebelow from the bottom, and the filling member RL can be more easily prevented from escaping from the through hole PH.

In particular, according to an embodiment, as described above with reference to FIG. 8, when the inclination angle α is about 50° or less, compared to the case where the inclination angle α exceeds about 50°, the second metal plate LP2 and the filling member RL overlap each other in a plan view, but the area where the second metal plate LP2 and the filling member RL are in contact with each other increases in cross-sectional view, and in this case the second metal plate LP2 stably supports the filling member RL from the bottom. Thus, it is possible to more effectively prevent the filling member RL from escaping from the through hole PH.

Although embodiments of the disclosure have been disclosed for illustrative purposes, those skilled in the art will appreciate that various modifications, additions and substitutions are possible, without departing from the scope and spirit of the disclosure+ as disclosed in the accompanying claims.

What is claimed is:

1. An electronic device, comprising:
a display panel;
a metal plate disposed below the display panel, wherein the metal plate includes a top surface that faces the display panel, a bottom surface opposite to the top surface, and a through hole that penetrates from the top surface to the bottom surface;
a filling member disposed in the through hole, wherein the filling member partially covers the bottom surface of the metal plate; and
a sensor disposed below the metal plate,
wherein a first width of the through hole that is coplanar with the top surface is greater than a second width of the through hole that is coplanar with the bottom surface.

2. An electronic device of claim 1, wherein the sensor overlaps the through hole in a plan view.

3. An electronic device of claim 2, wherein the sensor is disposed outside the through hole.

4. An electronic device of claim 3, wherein a maximum width of the sensor is greater than a maximum width of the through hole.

5. An electronic device of claim 2, wherein the sensor is a fingerprint sensor.

6. An electronic device of claim 1, wherein widths of the through hole decrease from an area that is coplanar with the top surface to an area that is coplanar with the bottom surface.

7. An electronic device of claim 6, wherein an inclination angle between the bottom surface of the metal plate and the side surface of the metal plate in contact with the through hole ranges from 40° to 50°.

8. An electronic device of claim 1, wherein a thickness of the filling member is greater than a thickness of the metal plate.

9. An electronic device of claim 1, wherein a thermal expansion coefficient of the filling member is greater than a thermal expansion coefficient of the metal plate.

10. An electronic device of claim 9, wherein the thermal expansion coefficient of the filling member is at least three times greater than the thermal expansion coefficient of the metal plate.

11. An electronic device of claim 1, wherein at least a part of a side surface of the filling member and a side surface of the metal plate are spaced apart from each other with an air gap therebetween.

12. An electronic device of claim 1, further comprising a bonding member disposed between the fingerprint sensor and the filling member and that bonds the fingerprint sensor to the filling member.

* * * * *